(12) United States Patent
Yamazaki et al.

(10) Patent No.: US 8,415,667 B2
(45) Date of Patent: Apr. 9, 2013

(54) SEMICONDUCTOR DEVICE

(75) Inventors: Shunpei Yamazaki, Setagaya (JP);
Daisuke Kawae, Kisarazu (JP);
Hiromichi Godo, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 156 days.

(21) Appl. No.: 12/957,434

(22) Filed: Dec. 1, 2010

(65) Prior Publication Data
US 2011/0133178 A1 Jun. 9, 2011

(30) Foreign Application Priority Data
Dec. 4, 2009 (JP) ................................ 2009-276274

(51) Int. Cl.
H01L 29/04 (2006.01)
H01L 31/036 (2006.01)
H01L 31/0376 (2006.01)
H01L 31/20 (2006.01)

(52) U.S. Cl.
USPC .................... 257/59; 257/72; 257/E29.117

(58) Field of Classification Search .................... 257/40, 257/59, 72, 347, E29.117, E29.273
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |

(Continued)

FOREIGN PATENT DOCUMENTS

| | | |
|---|---|---|
| EP | 1209748 A | 5/2002 |
| EP | 1737044 A | 12/2006 |

(Continued)

OTHER PUBLICATIONS

International Search Report (Application No. PCT/JP2010/070061) Dated Feb. 8, 2011.

(Continued)

*Primary Examiner* — Hoai V Pham
(74) *Attorney, Agent, or Firm* — Eric J. Robinson; Robinson Intellectual Property Law Office, P.C.

(57) ABSTRACT

One object is to provide a p-channel transistor including an oxide semiconductor. Another object is to provide a complementary metal oxide semiconductor (CMOS) structure of an n-channel transistor including an oxide semiconductor and a p-channel transistor including an oxide semiconductor. A p-channel transistor including an oxide semiconductor includes a gate electrode layer, a gate insulating layer, an oxide semiconductor layer, and a source and drain electrode layers in contact with the oxide semiconductor layer. When the electron affinity and the band gap of an oxide semiconductor used for the oxide semiconductor layer in the semiconductor device, respectively, are $\chi$ (eV) and $E_g$ (eV), the work function ($\phi_m$) of the conductor used for the source electrode layer and the drain electrode layer satisfies $\phi_m > \chi + E_g/2$ and the barrier for holes ($\phi_{Bp}$) represented by ($\chi+E_g-\phi_m$) is less than 0.25 eV.

8 Claims, 20 Drawing Sheets

U.S. PATENT DOCUMENTS

| | | | |
|---|---|---|---|
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,655,516 | B2 | 2/2010 | Ikeda |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,791,074 | B2 | 9/2010 | Iwasaki |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0267762 | A1 | 11/2007 | Yu et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0045397 | A1 | 2/2009 | Iwasaki |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0123130 | A1 | 5/2010 | Akimoto et al. |
| 2010/0193782 | A1 | 8/2010 | Sakata |
| 2010/0258802 | A1 | 10/2010 | Godo et al. |
| 2010/0276689 | A1 | 11/2010 | Iwasaki |
| 2010/0279462 | A1 | 11/2010 | Iwasaki |
| 2011/0114999 | A1* | 5/2011 | Yamazaki et al. ............ 257/280 |

FOREIGN PATENT DOCUMENTS

| | | |
|---|---|---|
| EP | 1858066 A | 11/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 | 6/2006 |
| JP | 2006-165528 | 6/2006 |
| JP | 2006-165529 | 6/2006 |
| JP | 2007-103918 A | 4/2007 |
| JP | 2007-134496 A | 5/2007 |
| JP | 2007-329472 A | 12/2007 |
| JP | 2008-071814 A | 3/2008 |
| JP | 2008-131022 A | 6/2008 |
| JP | 2009-111125 A | 5/2009 |
| JP | 2010-263195 A | 11/2010 |
| WO | WO-2004/114391 | 12/2004 |
| WO | WO-2007/029844 | 3/2007 |

OTHER PUBLICATIONS

Written Opinion (Application No. PCT/JP2010/070061) Dated Feb. 8, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9 and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] At Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, December 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE

TECHNICAL FIELD

The present invention relates to a semiconductor device including an oxide semiconductor and a manufacturing method thereof.

Note that the semiconductor devices in this specification indicate all the devices which can operate by using semiconductor characteristics, and an electronic optical device, a semiconductor circuit, and an electronic appliance are all included in the semiconductor devices.

BACKGROUND ART

A technique for forming a thin film transistor (TFT) using a semiconductor thin film (with a thickness of approximately several nanometers to several hundreds of nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. A silicon-based semiconductor material is known as a semiconductor thin film that can be applied to a thin film transistor, and in addition, an oxide semiconductor has attracted attention as another material that can be applied to a thin film transistor.

As a material for the oxide semiconductor, zinc oxide or a material containing zinc oxide as its component is known. Further, a thin film transistor formed using an amorphous oxide (an oxide semiconductor) having an electron carrier concentration of less than $10^{18}/cm^3$ is disclosed (see Patent Documents 1 to 3).

Reference

[Patent Document 1] Japanese Published Patent Application No. 2006-165527

[Patent Document 2] Japanese Published Patent Application No. 2006-165528

[Patent Document 3] Japanese Published Patent Application No. 2006-165529

DISCLOSURE OF INVENTION

In order to realize a semiconductor device including a thin film transistor that has flexibility in designing, higher functions, and higher reliability, a transistor having both polarities of an n-channel transistor and a p-channel transistor is needed. However, it is difficult that a p-channel transistor formed using an oxide semiconductor has excellent characteristics to be practically used.

In view of the problem, it is an object of one embodiment of the present invention to provide a p-channel transistor including an oxide semiconductor.

It is another object of one embodiment of the present invention to provide a complementary metal oxide semiconductor (CMOS) structure of an n-channel transistor including an oxide semiconductor and a p-channel transistor including an oxide semiconductor.

Further, it is another object of one embodiment of the present invention to provide a highly functional and highly reliable semiconductor device including a transistor including an oxide semiconductor.

The oxide semiconductor according to one embodiment of the present invention is an oxide semiconductor that is made to be an intrinsic (i-type) semiconductor or made to be as close to an intrinsic semiconductor as possible by being highly purified by removal of hydrogen that is an n-type impurity so that an impurity other than a main component of the oxide semiconductor is prevented from being contained therein as much as possible. In other words, the oxide semiconductor according to one embodiment of the present invention has a feature in that it is made to be an i-type (intrinsic) semiconductor or made to be close thereto not by addition of an impurity but by being highly purified by removal of an impurity such as hydrogen or water as much as possible. Thus, an oxide semiconductor layer of one embodiment of the present invention is highly purified to become electrically i-type (intrinsic).

Accordingly, the oxide semiconductor layer used in this specification functions as a path through which a carrier passes without being defined as an n-type oxide semiconductor layer or a p-type oxide semiconductor layer. An n-channel transistor (also referred to as an NMOS transistor) and a p-channel transistor (also referred to as a PMOS transistor) can be formed using an i-type (intrinsic) oxide semiconductor layer. The work function ($\phi_m$) of a conductor used for a source and drain electrode layers in contact with the oxide semiconductor layer is controlled so as to determine an n-channel transistor and a p-channel transistor.

A p-channel transistor can be obtained under the following conditions: the work function ($\phi_m$) of the conductor used for the source electrode layer and the drain electrode layer is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV.

When the barrier for holes ($\phi_{Bp}$) represented by ($\chi + E_g - \phi_m$) is smaller than the barrier for electrons ($\phi_{Bn}$) represented by ($\phi_m - \chi$) (i.e., $\phi_{Bn} > \phi_{Bp}$), holes are easily injected.

Accordingly, in order to make a p-channel transistor, the work function ($\phi_m$) of the conductor used for the source electrode layer and the drain electrode layer is needed to satisfy $\phi_m > \chi + E_g/2$.

Further, when the barrier for holes ($\phi_{Bp}$) represented by ($\chi + E_g - \phi_m$) is less than 0.25 eV, the p-channel transistor can exhibit favorable on-current characteristics.

Accordingly, the work function ($\phi_m$) of the conductor used for the source electrode layer and the drain electrode layer satisfies $\phi_m > \chi + E_g/2$ and the barrier for holes ($\phi_{Bp}$) represented by ($\chi + E_g - \phi_m$) is less than 0.25 eV, so that holes are injected from the conductor of the source electrode layer, pass through the oxide semiconductor, and reach the conductor of the drain electrode layer. Thus, operation as a p-channel transistor can be obtained.

As an oxide semiconductor film, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; or an In—O-based film, a Sn—O-based film, or a Zn—O-based film can be used. In addition, the above oxide semiconductor film may contain $SiO_2$.

As the oxide semiconductor film, a thin film represented by $InMO_3 (ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is represented by $InMO_3 (ZnO)_m$ (m>0), which includes Ga as m, is referred to as the In—Ga—Zn—O-based oxide semiconductor, and a thin film of the In—Ga—Zn—O-based oxide semiconductor is also referred to as an In—Ga—Zn—O-based non-single-crystal film.

As the conductor used for the source electrode layer and the drain electrode layer of the p-channel transistor, metal oxide such as tin oxide (SnO), LaCuOCh (Ch=chalcogen such as S or Se), CuAO$_2$ (A=B, Al, Ga, In, or the like), SrCu$_2$O$_2$, NiO, Cu$_2$O, or CuO can be used, for example. An impurity may be added in order to increase the conductivity of the metal oxide. For example, LaCuOCh to which Mg is added or NiO to which Li is added can be used.

One embodiment of the present invention disclosed in this specification is a semiconductor device that includes a transistor including a gate electrode layer, a gate insulating layer, an oxide semiconductor layer, and a source and drain electrode layers in contact with the oxide semiconductor layer. When the electron affinity and the band gap of an oxide semiconductor used for the oxide semiconductor layer in the semiconductor device, respectively, are $\chi$ (eV) and $E_g$ (eV), the work function ($\phi_m$) of the conductor used for the source and the drain electrode layer satisfies $\phi_m > \chi + E_g/2$ and the barrier for holes ($\phi_{Bp}$) represented by ($\chi + E_g - \phi_m$) is less than 0.25 eV.

Another embodiment of the present invention disclosed in this specification is a semiconductor device that includes a transistor including a gate electrode layer, a gate insulating layer, an oxide semiconductor layer containing at least one of indium, gallium, and zinc, and a source and drain electrode layers in contact with the oxide semiconductor layer. When the electron affinity and the band gap of an oxide semiconductor used for the oxide semiconductor layer in the semiconductor device, respectively, are $\chi$ (eV) and $E_g$ (eV), the work function ($\phi_m$) of the conductor used for the source and the drain electrode layer satisfies $\phi_m > \chi + E_g/2$ and the barrier for holes ($\phi_{Bp}$) represented by ($\chi + E_g - \phi_m$) is less than 0.25 eV.

Another embodiment of the present invention disclosed in this specification is a semiconductor device that includes a p-channel transistor including a first gate electrode layer, a first gate insulating layer, a first oxide semiconductor layer, and a first source and a first drain electrode layer in contact with the first oxide semiconductor layer and an n-channel transistor including a second gate electrode layer, a second gate insulating layer, a second oxide semiconductor layer, and a second source and a second drain electrode layer in contact with the second oxide semiconductor layer. When the electron affinity and the band gap of a first oxide semiconductor used for the first oxide semiconductor layer in the semiconductor device, respectively, are $\chi_1$ (eV) and $E_{g1}$ (eV), the work function ($\phi_{m1}$) of the first conductor used for the first source and the first drain electrode layer satisfies $\phi_{m1} > \chi_1 + E_{g1}/2$ and the barrier for holes ($\phi_{Bp1}$) represented by ($\chi_1 + E_{g1} - \phi_{m1}$) is less than 0.25 eV.

Another embodiment of the present invention disclosed in this specification is a semiconductor device that includes a p-channel transistor including a first gate electrode layer, a first gate insulating layer, a first oxide semiconductor layer, and a first source and a first drain electrode layer in contact with the first oxide semiconductor layer and an n-channel transistor including a second gate electrode layer, a second gate insulating layer, a second oxide semiconductor layer, and a second source and a second drain electrode layer in contact with the second oxide semiconductor layer. When the electron affinity and the band gap of the first oxide semiconductor used for the first oxide semiconductor layer in the semiconductor device, respectively, are $\chi_1$ (eV) and $E_{g1}$ (eV), the work function ($\phi_{m1}$) of the first conductor used for the first source and the first drain electrode layer satisfies $\phi_{m1} > \chi_1 + E_{g1}/2$, the barrier for holes ($\phi_{Bp1}$) represented by ($\chi_1 + E_{g1} - \phi_{m1}$) is less than 0.25 eV, and the first oxide semiconductor used for the first oxide semiconductor layer and a second oxide semiconductor used for the second oxide semiconductor layer are formed using the same material.

Note that the ordinal numbers such as "first" and "second" in this specification are used for convenience and do not denote the order of steps and the stacking order of layers. In addition, the ordinal numbers in this specification do not denote particular names which specify the present invention.

A p-channel transistor (a PMOS transistor) can be obtained under the following conditions: the work function ($\phi_m$) of the conductor used for a source electrode layer and a drain electrode layer is larger than the sum of the electron affinity ($\chi$) of an oxide semiconductor and half of the energy gap ($E_g/2$) of an oxide semiconductor (i.e., $\phi_m > \chi + E_g/2$), and the barrier for holes ($\phi_{Bp}$) represented by ($\chi + E_g - \phi_m$) is less than 0.25 eV.

One embodiment of the present invention can provide a complementary metal oxide semiconductor (CMOS) structure of an n-channel transistor including an oxide semiconductor and a p-channel transistor including an oxide semiconductor.

One embodiment of the present invention can provide a highly functional and highly reliable semiconductor device in which a p-channel transistor and an n-channel transistor which include an oxide semiconductor are included and both polarities of the n-channel transistor and the p-channel transistor are used.

BEST MODE FOR CARRYING OUT THE INVENTION

Figure 1A:
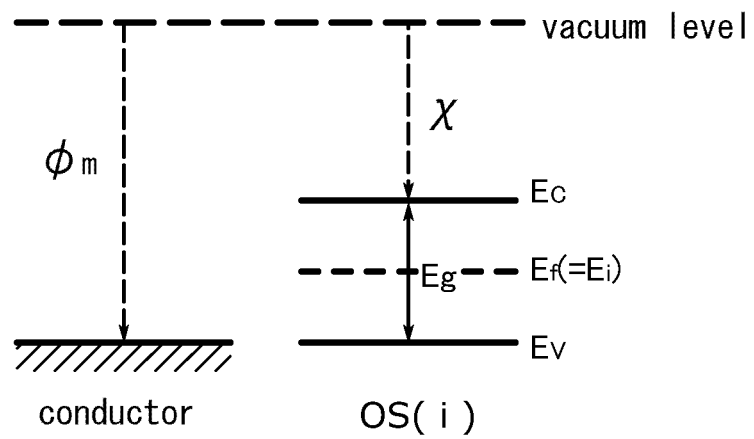
FIG. 1A is a band diagram of a conductor and an oxide semiconductor layer before the conductor and the oxide semiconductor layer are bonded and FIGS. 1B and 1C are energy band diagrams (schematic diagrams) of a cross-section taken along O-P in FIG. 6.

Embodiments of the present invention will be hereinafter described in detail with reference to the accompanying drawings. Note that the present invention is not limited to the description below, and it is easily understood by those skilled in the art that modes and details disclosed herein can be modified in various ways. Therefore, the present invention is not construed as being limited to description of the embodiments below.

(Embodiment 1)

In this embodiment, one mode of a p-channel transistor including an oxide semiconductor will be described.

An oxide semiconductor layer used in this specification is highly purified to become electrically i-type (intrinsic).

In order to prevent variation in electric characteristics of the transistor including an oxide semiconductor layer, impurities such as hydrogen, moisture, a hydroxyl group, or hydride (also referred to as a hydrogen compound) which cause the variation are removed from the oxide semiconductor layer. Additionally, the oxide semiconductor layer is highly purified to become electrically i-type (intrinsic) by supplying oxygen which is a major component of an oxide semiconductor, which is simultaneously reduced in a step of removing impurities.

Therefore, it is preferable that the oxide semiconductor contains as little hydrogen as possible. Hydrogen contained in the oxide semiconductor is preferably less than $1\times10^{16}/cm^3$ and is removed as much as possible to be close to 0.

The highly purified oxide semiconductor includes extremely few carriers (close to 0). The carrier concentration of the oxide semiconductor is less than $1\times10^{14}/cm^3$, preferably less than $1\times10^{12}/cm^3$, further preferably less than $1\times10^{11}/cm^3$.

Since the oxide semiconductor includes extremely few carriers, when a bias is applied in the reverse direction and the current-voltage (I-V) characteristics of the transistor are measured, the off-state current can be reduced. It is preferable that an off-state current be as small as possible. An off-state current (also referred to as a leakage current) is a current that flows between a source and a drain of a transistor in the case where a given gate voltage between −1 V to −10 V is applied. A current value per 1 μm in a channel width (w) of a transistor including an oxide semiconductor, which is disclosed in this specification, is less than or equal to 100 aA/μm, preferably less than or equal to 10 aA/μm, further preferably less than or equal to 1 aA/μm.

The above concentration range of hydrogen can be obtained by secondary ion mass spectrometry (SIMS) or on the basis of data of SIMS. In addition, the carrier concentration can be measured by Hall effect measurement. As an example of equipment used for Hall effect measurement, the specific resistance/hole measuring system ResiTest 8310 (manufactured by TOYO Corporation) can be given. With the specific resistance/Hall measuring system ResiTest 8310, the direction and strength of a magnetic field are changed in a certain cycle and in synchronization therewith, only a Hall electromotive voltage caused in a sample is detected, so that AC (alternate current) Hall measurement can be performed.

In addition, not only impurities such as moisture in the oxide semiconductor layer but also those existing in a gate insulating layer are reduced, and impurities such as moisture existing in interfaces between the oxide semiconductor film and films provided over and under and in contact with the oxide semiconductor film are reduced.

The oxide semiconductor is highly purified so that impurities other than main components of the oxide semiconductor are not contained as much as possible, whereby favorable operation of the transistor can be obtained.

Therefore, the oxide semiconductor layer used in this specification functions as a path through which a carrier passes without being defined as an n-type oxide semiconductor layer or a p-type oxide semiconductor layer. An n-channel transistor (also referred to as an NMOS transistor) and a p-channel transistor (also referred to as a PMOS transistor) can be formed using an i-type (intrinsic) oxide semiconductor layer. The work function ($\phi_m$) of a conductor used for a source and drain electrode layers in contact with the oxide semiconductor layer is controlled so as to determine an n-channel transistor and a p-channel transistor.

The calculation results of change in an electron injection property and a hole injection property to the oxide semiconductor layer depending on the work function of the conductor used for the source and the drain electrode layer, and change in polarities (n-channel or p-channel) of a MOS transistor depending on the change in the electron and hole injection properties will be described below. The calculation is performed using a two dimensional device simulator. Note that software ATLAS produced by Silvaco, Inc. is used as the device simulator here.

Figure 2A:
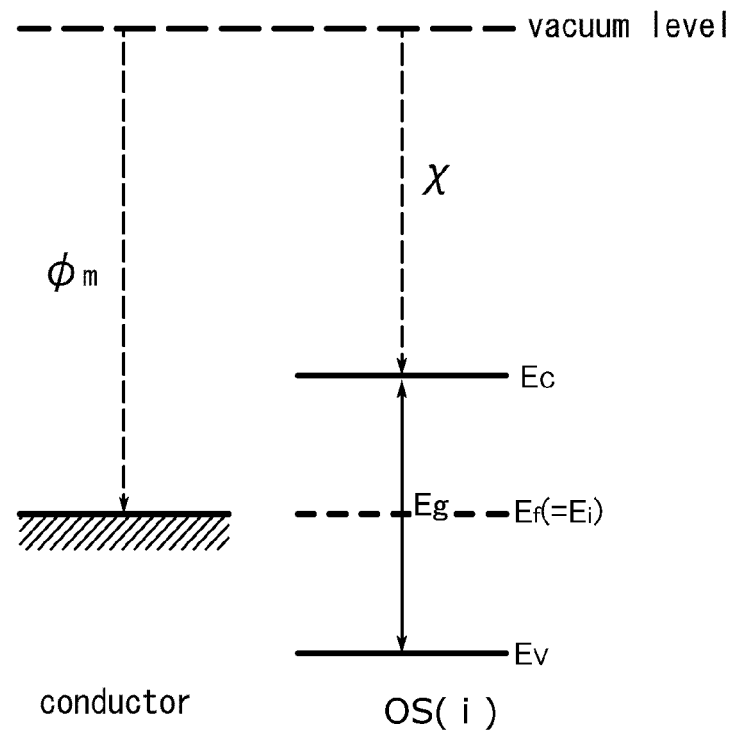
FIGS. 2A and 2B are diagrams illustrating a relation among the vacuum level, the work function ($\phi_m$) of a conductor, and the electron affinity ($\chi$) of an oxide semiconductor.
Figure 2B:
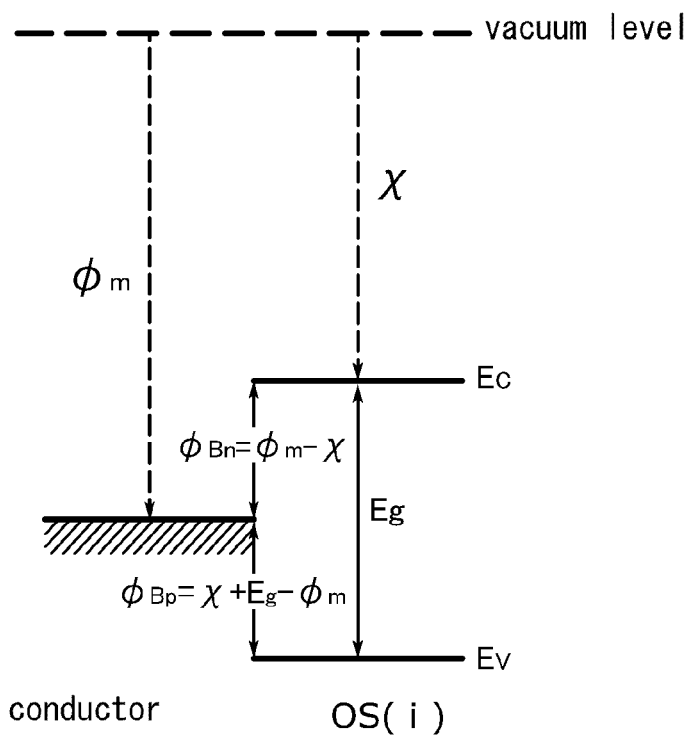

FIGS. 2A and 2B each conceptually illustrate a band structure of a bonding portion between the conductor used for the source or drain electrode layer and the oxide semiconductor (described as OS(i)) used for the oxide semiconductor layer. In FIGS. 2A and 2B, the work function of the conductor is represented by $\phi_m$ (eV), the electron affinity of the oxide semiconductor is represented by $\chi$ (eV), the level of valence band is represented by $E_v$, the level of the conduction band is represented by $E_c$, and the energy gap is represented by $E_g$ (eV). FIGS. 2A and 2B illustrate the conductor and the oxide semiconductor in the case where $\phi_m > \chi$. FIG. 2A illustrates a relation among the vacuum level, the work function ($\phi_m$) of the conductor, and the electron affinity ($\chi$) of the oxide semiconductor.

A conventional oxide semiconductor is generally of n-type, and the Fermi level ($E_f$) in that case is positioned closer to the conduction band and is away from the intrinsic Fermi level ($E_i$) that is located in the middle of the band gap. Note that it is known that some hydrogen in the oxide semiconductor is a donor and might be one of factors that make the oxide semiconductor to be an n-type oxide semiconductor.

The oxide semiconductor according to one embodiment of the present invention is an oxide semiconductor that is made to be an intrinsic (i-type) semiconductor or made to be as close to an intrinsic semiconductor as possible by being highly purified by removal of hydrogen that is an n-type impurity so that an impurity other than a main component of the oxide semiconductor is prevented from being contained therein as much as possible. In other words, the oxide semiconductor according to one embodiment of the present invention has a feature in that it is made to be an i-type (intrinsic) semiconductor or made to be close thereto not by addition of an impurity but by being highly purified by removal of an impurity such as hydrogen or water as much as possible. As a result, the Fermi level ($E_f$) can be at the same level as the intrinsic Fermi level ($E_i$).

FIG. 2B illustrates a relation between the barrier for electrons ($\phi_{Bn}$) represented by ($\phi_m-\chi$), and the barrier for holes ($\phi_{Bp}$) represented by ($\chi+E_g-\phi_m$). The electrons and holes flow from the conductor toward the oxide semiconductor side. As seen from FIG. 2B, when the barrier for holes ($\phi_{Bp}$) is larger than the barrier for electrons ($\phi_{Bn}$) (i.e., $\phi_{Bn}<\phi_{Bp}$), electrons are easily injected; in contrast, when the barrier for holes ($\phi_{Bp}$) is smaller than the barrier for electrons ($\phi_{Bn}$) (i.e., $\phi_{Bn}>\phi_{Bp}$), holes are easily injected. The electrons or holes injected from the conductor of the source electrode layer to the oxide semiconductor pass through the oxide semiconductor, and reach the conductor of the drain electrode layer.

Figure 3:
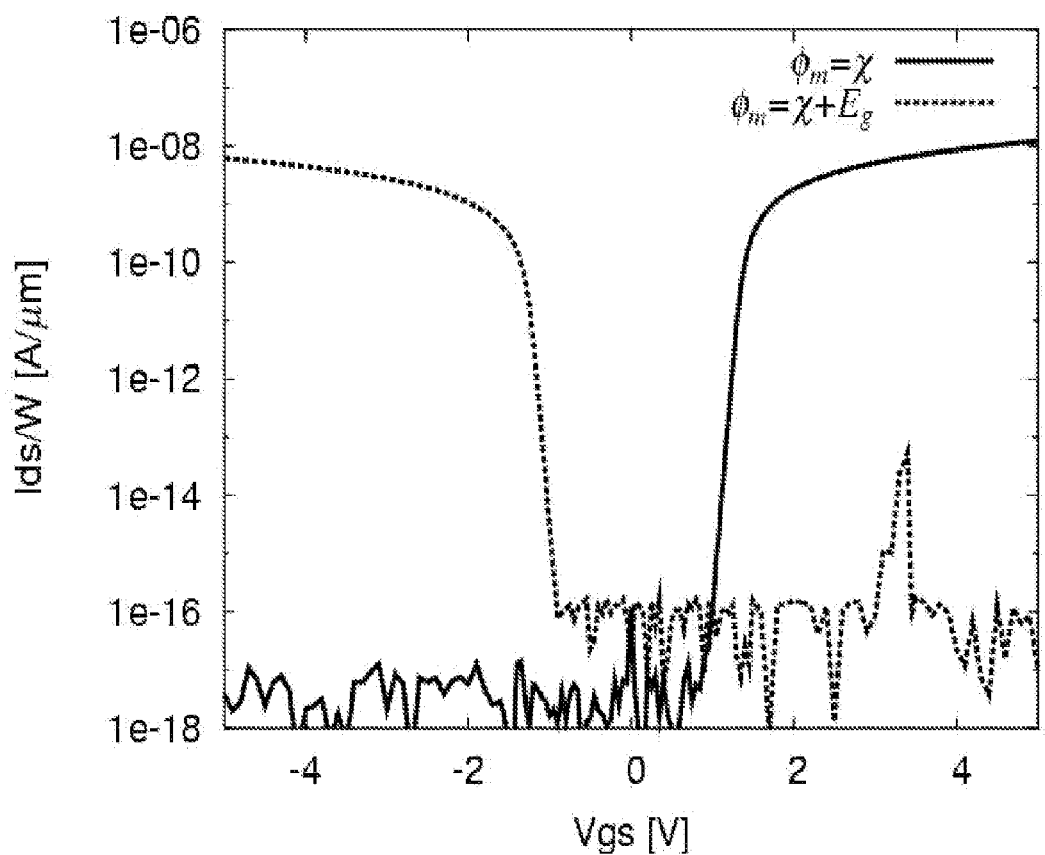
FIG. 3 is a graph showing characteristics of a gate-source voltage (Vgs) versus a source-drain current (Ids) (Vgs-Ids characteristics) of a transistor based on a calculation result.
Figure 6:
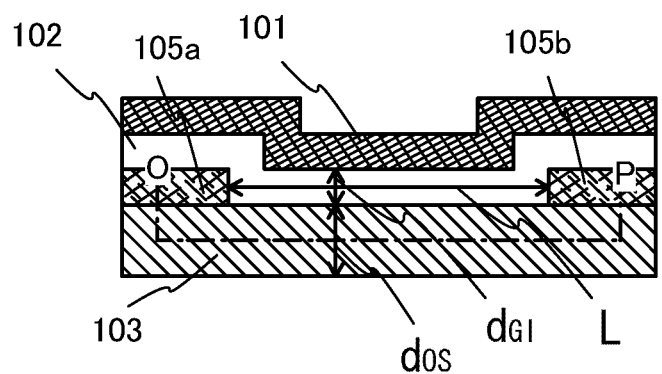
FIG. 6 is a view illustrating a semiconductor device.

FIG. 3 shows results of a calculation of change in characteristics (Vgs-Ids characteristics) of the gate-source voltage (Vgs) and the source-drain current (Ids) of the transistor in the case where the work function ($\phi_m$) of the conductor used for the source electrode layer and the drain electrode layer satisfies $\phi_m=\chi+E_g$ and in the case where the work function ($\phi_m$) thereof satisfies $\phi_m=\chi$. Note that an In—Ga—Zn—O-based oxide semiconductor is used as an example of the oxide semiconductor; the electron affinity ($\chi$) thereof is set to 4.3 eV; and the energy gap (Eg) thereof is set to 3.15 eV. As illustrated in FIG. 6, a planar transistor is used with a top-gate structure in which a source electrode layer 105a and a drain electrode layer 105b are provided in contact with an oxide semiconductor layer 103, a gate insulating layer 102 is provided to cover the oxide semiconductor layer 103 and the source electrode layer 105a and the drain electrode layer 105b, and a gate electrode layer 101 is provided over the gate insulating layer 102. Note that Vgs-Ids characteristics is calculated under the following conditions: the thickness ($d_{OS}$) of the oxide semiconductor layer 103 is 200 nm, the thickness ($d_{GI}$) of the gate insulating layer 102 is 100 nm, the dielectric constant is 4.0, the channel length (L) is 10 μm, the channel width (W) is 1 μm, and the gate-drain voltage (Vds) is 0.1 V.

As shown in FIG. 3, characteristics of n-type in which the current value is increased in the positive gate bias are exhibited when $\phi_m=\chi$ ($\phi_m<\chi+E_g/2$); and in contrast, characteristics of p-type in which the current value is increased in the negative gate bias are exhibited when $\phi_m=\chi+E_g$ ($\phi_m>\chi+E_g/2$).

Accordingly, in order to make a p-channel transistor, the work function ($\phi_m$) of the conductor used for the source electrode layer and the drain electrode layer is needed to satisfy $\phi_m>\chi+E_g/2$.

Figure 4:
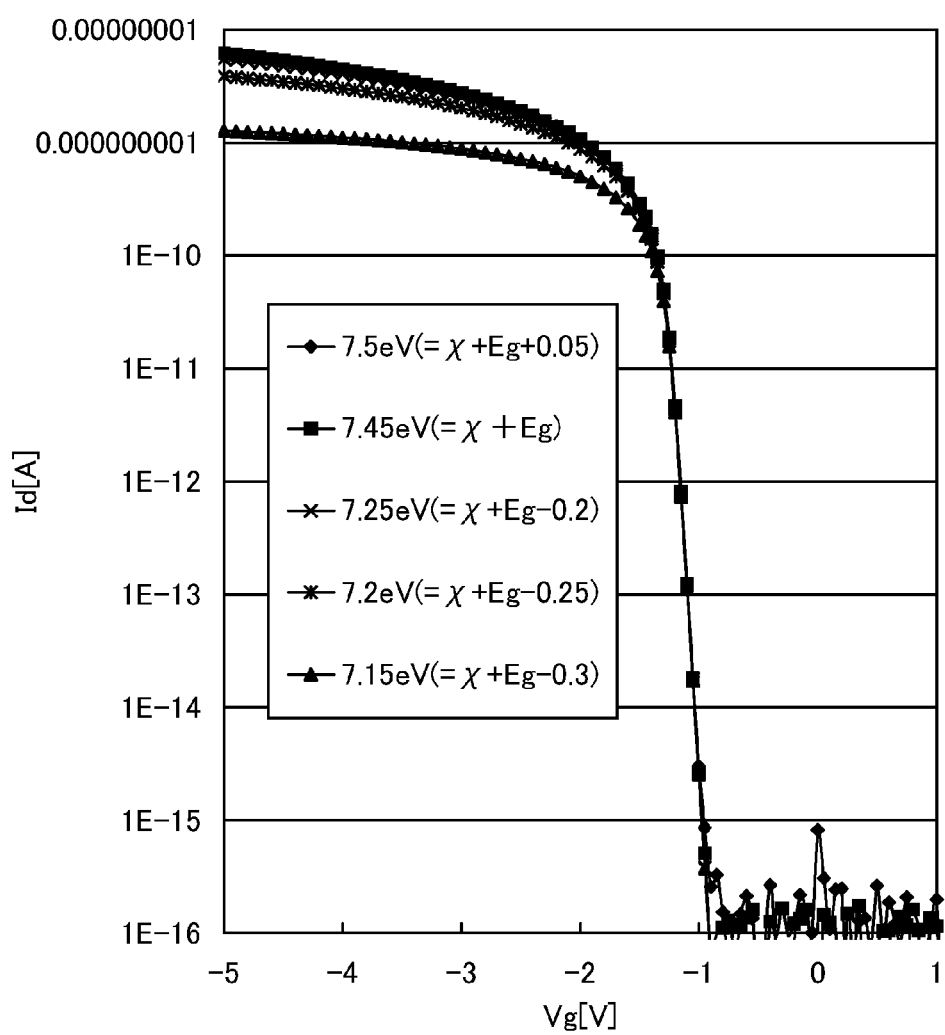
FIG. 4 is a graph showing characteristics of a gate-source voltage (Vgs) versus a source-drain current (Ids) (Vgs-Ids characteristics) of a transistor based on a calculation result.

FIG. 4 shows the change of Vgs-Ids characteristics of the transistor when the value of the work function ($\phi_m$) is changed within the range of the work function ($\phi_m$) that satisfies $\phi_m>\chi+E_g/2$. In FIG. 4, the Vgs-Ids characteristics in the case where the work function ($\phi_m$) is 7.5 eV, 7.45 eV, 7.25 eV, 7.2 eV, and 7.15 eV are represented by black rhombus data markers, black square data markers, x-shaped data markers, asterisk data markers, and black triangle data markers, respectively.

Figure 5:
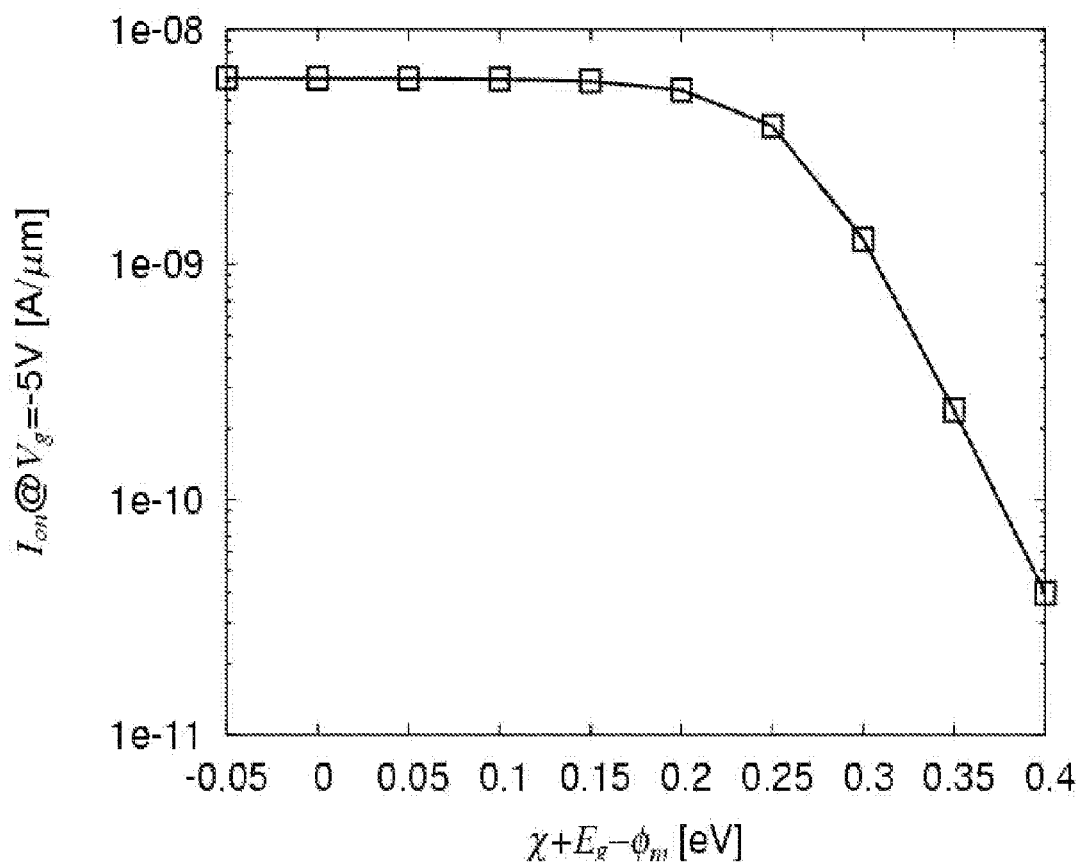
FIG. 5 is a graph showing a relation between a drain current value (Ids) when the gate-source voltage (Vgs) is 5 V and the barrier for holes ($\phi_{Bp}$) represented by ($\chi + E_g - \phi_m$)

FIG. 5 shows a relation between the drain current (Ids) value and the barrier for holes ($\phi_{Bp}$) represented by ($\chi+E_g-\phi_m$) when the gate-source voltage (Vgs) in FIG. 4 is 5 V.

As shown in FIG. 5, when the barrier for holes ($\phi_{Bp}$) represented by ($\chi+E_g-\phi_m$) is less than 0.25 eV, favorable on-current characteristics of a p-channel transistor are exhibited.

Figure 1B:
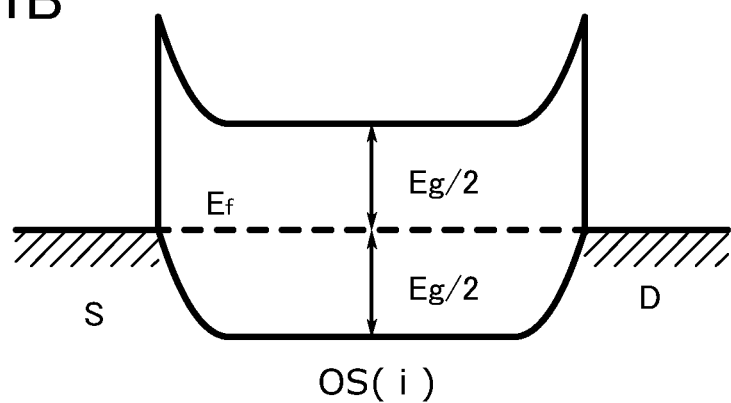
Figure 1C:
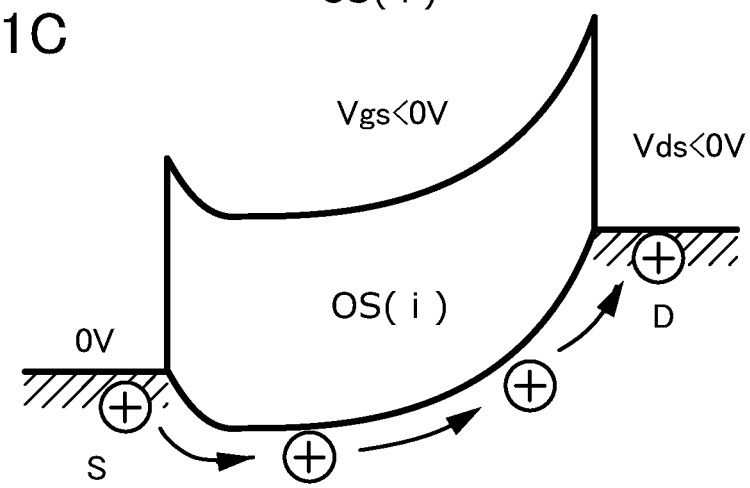

FIGS. 1A to 1C are energy band diagrams (schematic diagrams). FIG. 1A is a band diagram of the conductor that is used for the source or drain electrode layer and the oxide semiconductor layer (OS(i)) before the conductor and the oxide semiconductor layer are bonded. The transistor of FIGS. 1A to 1C is a p-channel transistor in which the work function ($\phi_m$) satisfies $\phi_{m1}>\chi_1+E_{g1}/2$ and the barrier for holes ($\phi_{Bp}$) represented by ($\chi+E_g-\phi_m$) is less than 0.25 eV so that $\phi_m=x+E_g$. In the p-channel transistor, holes from the source electrode layer pass through the valence band ($E_v$) of the semiconductor layer and reach the drain layer, so that the p-channel transistor operates.

FIGS. 1B and 1C are energy band diagrams (schematic diagrams) of a cross-section taken along O-P in FIG. 6. FIG. 1B shows the case where the source electrode layer (S), the oxide semiconductor layer (OS(i)), and the drain electrode layer (D) are bonded and the source and the drain have voltage of the same potential (Vds=0 V). FIG. 1C shows the case where a negative potential (Vds<0 V) with respect to the source is applied to the drain.

As illustrated in FIG. 1C, by appropriate selection of the work function ($\phi_m$) of the source electrode layer and the drain electrode layer, holes can be efficiently injected and fed. Further, the barrier for electrons ($\phi_{Bn}$) is high because the band gap is large; thus, the leakage current (the off-state current) generated when a reverse bias is applied to the gate can be suppressed.

Accordingly, a p-channel transistor (a PMOS transistor) can be obtained under the following conditions: the work function ($\phi_m$) of the conductor used for the source electrode layer and the drain electrode layer satisfies $\phi_m>\cap+E_g/2$, and the barrier for holes ($\phi_{Bp}$) represented by ($\chi+E_g-\phi_m$) is less than 0.25 eV.

As an oxide semiconductor film, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; or a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; an In—O-based film, a Sn—O-based film, or a Zn—O-based film can be used. In addition, the above oxide semiconductor film may contain $SiO_2$.

As the oxide semiconductor film, a thin film represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is represented by $InMO_3(ZnO)_m$ (m>0), which includes Ga as M, is referred to as the In—Ga—Zn—O-based oxide semiconductor, and a thin film of the In—Ga—Zn—O-based oxide semiconductor is also referred to as an In—Ga—Zn—O-based non-single-crystal film.

As the conductor used for the source electrode layer and the drain electrode layer of the p-channel transistor, metal oxide such as tin oxide (SnO), LaCuOCh (Ch=chalcogen such as S or Se), $CuAO_2$ (A=B, Al, Ga, In, or the like), $SrCu_2O_2$, NiO, $Cu_2O$, or CuO can be used, for example. An impurity may be added in order to increase the conductivity of the metal oxide. For example, LaCuOCh to which Mg is added or NiO to which Li is added can be used. The source and the drain electrode layer may be formed by a sputtering method or a vacuum evaporation method.

Accordingly, A p-channel transistor (a PMOS transistor) can be obtained under the following conditions: the work function ($\phi_m$) of the conductor used for the source electrode layer and the drain electrode layer is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV.

Therefore, a highly functional and highly reliable semiconductor device in which a p-channel transistor and an n-channel transistor which include an oxide semiconductor are included and both polarities of the n-channel transistor and the p-channel transistor are used.

(Embodiment 2)

In this embodiment, examples of other structures of a transistor that can be applied to the p-channel transistor disclosed in this specification will be described.

Figure 7A:
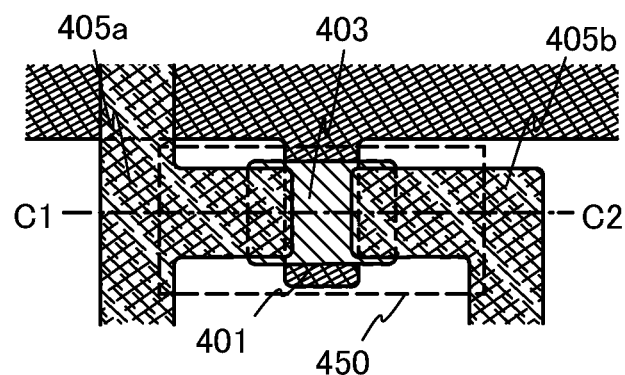
FIGS. 7A and 7B are views illustrating a semiconductor device.
Figure 7B:
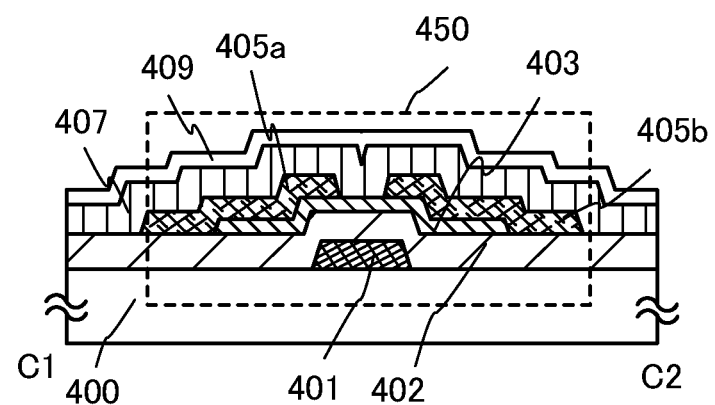

FIGS. 7A and 7B illustrate an example of a planar structure and a cross-sectional structure of a semiconductor device. A transistor 450 illustrated in FIGS. 7A and 7B is one of bottom-gate thin film transistors and is also referred to as an inverted staggered thin film transistor. FIG. 7A is a plan view of the transistor 450 having a bottom-gate structure and FIG. 7B is a cross-sectional view taken along line C1-C2 in FIG. 7A. The transistor 450 is a p-channel transistor.

The transistor 450 includes, over a substrate 400 having an insulating surface, a gate electrode layer 401, a gate insulating layer 402, an oxide semiconductor layer 403, a source electrode layer 405a, and a drain electrode layer 405b. An insulating layer 407 that covers the transistor 450 is stacked over the oxide semiconductor layer 403. A protective insulating layer 409 is formed over the insulating layer 407.

Figure 8:
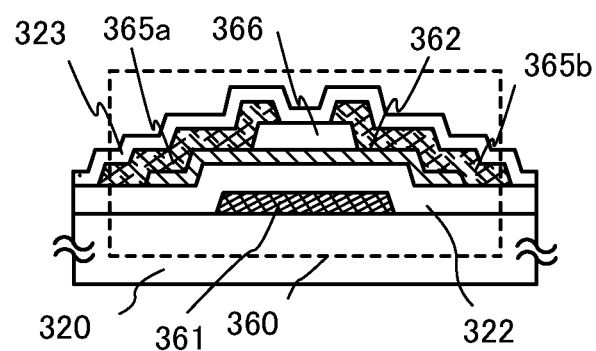
FIG. 8 is a view illustrating a semiconductor device.

FIG. 8 illustrates another example of a cross-sectional structure of a semiconductor device. A transistor 360 illustrated in FIG. 8 is one of bottom-gate structure transistors called a channel-protective (channel-stop) transistor and is also referred to as an inverted staggered thin film transistor. The transistor 360 is a p-channel transistor.

The transistor 360 includes, over a substrate 320 having an insulating surface, a gate electrode layer 361, a gate insulating layer 322, an oxide semiconductor layer 362, an insulating layer 366 that functions as a channel-protective layer covering a channel formation region of the oxide semiconductor layer 362, a source electrode layer 365a, and a drain electrode layer 365b. A protective insulating layer 323 that covers the transistor 360 is formed.

Figure 9:
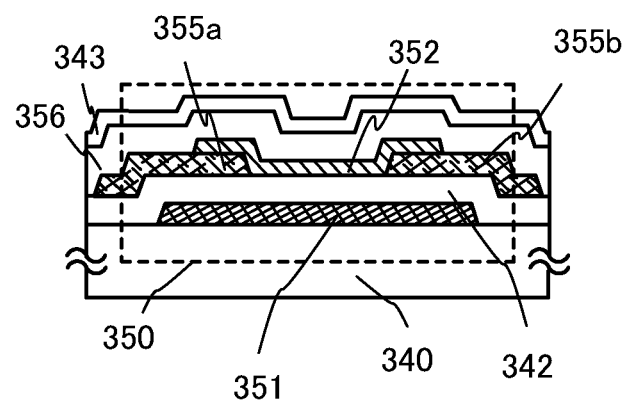
FIG. 9 is a view illustrating a semiconductor device.

FIG. 9 illustrates another example of a cross-sectional structure of a semiconductor device. The transistor 350 is a bottom gate thin film transistor and includes, over a substrate 340 having an insulating surface, a gate electrode layer 351, a gate insulating layer 342, a source electrode layer 355a, a drain electrode layer 355b, and an oxide semiconductor layer 352. An insulating layer 356 that covers the transistor 350 and is in contact with the oxide semiconductor layer 352 is formed. A protective insulating layer 343 is formed over the insulating layer 356. Note that the transistor 350 is a p-channel transistor.

In the transistor 350, the gate insulating layer 342 exists in the entire region including the transistor 350, and the gate electrode layer 351 is provided between the gate insulating layer 342 and the substrate 340 having an insulating surface. The source electrode layer 355a and the drain electrode layer 355b are provided over the gate insulating layer 342. Further, the oxide semiconductor layer 352 is provided over the gate insulating layer 342, the source electrode layer 355a, and the drain electrode layer 355b. In this embodiment, the source electrode layer 355a and the drain electrode layer 355b extend beyond the peripheral portion of the oxide semiconductor layer 352.

Figure 10A:
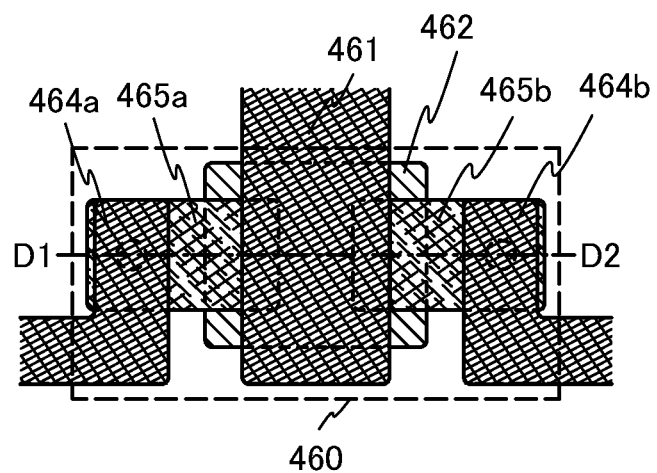
FIGS. 10A and 10B are views illustrating a semiconductor device.
Figure 10B:
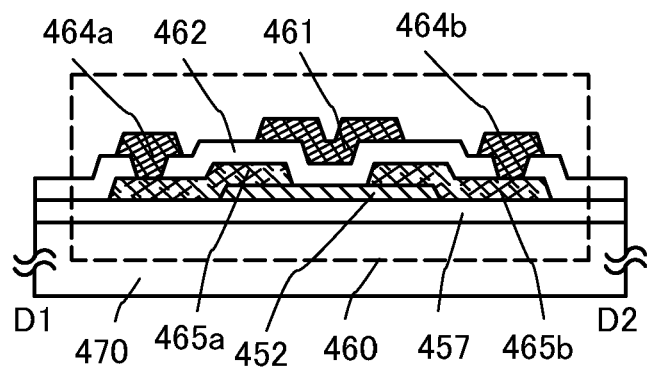

FIGS. 10A and 10B illustrate another example of a planar structure and a cross-sectional structure of a semiconductor device. A transistor 460 illustrated in FIGS. 10A and 10B is one of top-gate thin film transistors. FIG. 10A is a plan view of the transistor 460 and FIG. 10B is a cross-sectional view taken along line D1-D2 in FIG. 10A. The transistor 460 is a p-channel transistor.

The transistor 460 includes, over a substrate 470 having an insulating surface, an insulating layer 457, an oxide semiconductor layer 452, a source electrode layer 465a, a drain electrode layer 465b, a gate insulating layer 462, and a gate electrode layer 461. A wiring layer 464a and a wiring layer 464b which are electrically connected to and in contact with the source electrode layer 465a and the drain electrode layer 465b, respectively, are provided.

Although description is given using single-gate transistors as the transistors 350, 360, 450, and 460, multi-gate transistors each including a plurality of channel formation regions may be formed as needed.

The oxide semiconductor according to one embodiment of the present invention is an oxide semiconductor that is made to be an intrinsic (i-type) semiconductor or made to be as close to an intrinsic semiconductor as possible by being highly purified by removal of hydrogen that is an n-type impurity so that an impurity other than a main component of the oxide semiconductor is prevented from being contained therein as much as possible. In other words, the oxide semiconductor according to one embodiment of the present invention has a feature in that it is made to be an i-type (intrinsic) semiconductor or made to be close thereto not by addition of an impurity but by being highly purified by removal of an impurity such as hydrogen or water as much as possible. Oxide semiconductor layers 352, 362, 403, and 452 are highly purified to become electrically i-type (intrinsic).

Therefore, it is preferable that the oxide semiconductor contains as little hydrogen as possible. Hydrogen contained in the oxide semiconductor is preferably less than $1 \times 10^{16}/cm^3$ and is removed as much as possible to be close to 0.

The highly purified oxide semiconductor includes extremely few carriers (close to 0). The carrier concentration of the oxide semiconductor is less than $1 \times 10^{14}/cm^3$, preferably less than $1 \times 10^{12}/cm^3$, further preferably less than $1 \times 10^{11}/cm^3$.

Since the oxide semiconductor includes extremely few carriers, when a bias is applied in the reverse direction and the current-voltage (I-V) characteristics of the transistor are measured, the off-state current can be reduced. It is preferable that an off-state current be as small as possible. An off-state current (also referred to as a leakage current) is a current that flows between a source and a drain of a transistor in the case where a given gate voltage between −1 V to −10 V is applied. A current value per 1 μm in a channel width (w) of a transistor including an oxide semiconductor, which is disclosed in this specification, is less than or equal to 100 aA/μm, preferably less than or equal to 10 aA/μm, further preferably less than or equal to 1 aA/μm.

In addition, not only impurities such as moisture in the oxide semiconductor layers 352, 362, 403, and 452 but also those existing in the gate insulating layers 322, 342, 402, and 462 are reduced, and impurities such as moisture existing in interfaces between the oxide semiconductor film and films provided over and under and in contact with the oxide semiconductor film are reduced.

The oxide semiconductors are highly purified so that impurities other than main components of the oxide semiconductors are not contained as much as possible, whereby favorable operation of the transistors 350, 360, 450, and 460 can be obtained.

Therefore, each of the oxide semiconductor layers 352, 362, 403, and 452 is not defined as an n-type oxide semiconductor layer or a p-type oxide semiconductor layer and functions as a path through which a carriers passes. An n-channel transistor (also referred to as an NMOS transistor) and a p-channel transistor (also referred to as a PMOS transistor) can be formed using an i-type (intrinsic) oxide semiconductor layer. The work function ($\phi_m$) of respective conductors used for the source electrode layers 355a, 365a, 405a, and 465a and the drain electrode layers 355b, 365b, 405b, and 465b in contact with the oxide semiconductor layers 352, 362, 403, and 452 is controlled, whereby p-channel transistors 350, 360, 450, and 460 can be manufactured.

A p-channel transistor can be obtained under the following conditions: the work function ($\phi_m$) of the respective conductors used for the source electrode layers 355a, 365a, 405a, and 465a and the drain electrode layers 355b, 365b, 405b, and 465b is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV.

When the barrier for holes ($\phi_{Bp}$) represented by ($\chi + E_g - \phi_m$) is smaller than the barrier for electrons ($\phi_{Bn}$) represented by ($\phi_m - \chi$) (i.e., $\phi_{Bn} > \phi_{Bp}$), holes are easily injected.

Accordingly, in order to obtain the transistors 350, 360, 450, and 460 which are p-channel transistors, the work function ($\phi_m$) of the respective conductors used for the source electrode layers 355a, 365a, 405a, and 465a and the drain electrode layers 355b, 365b, 405b, and 465b is needed to satisfy $\phi_m > \chi + E_g/2$.

Further, when the barrier for holes ($\phi_{Bp}$) represented by ($\chi + E_g - \phi_m$) is less than 0.25 eV, the p-channel transistor can exhibit favorable on-current characteristics.

As described above, the work function ($\phi_m$) of the respective conductors used for the source electrode layers 355a, 365a, 405a, and 465a and the drain electrode layers 355b, 365b, 405b, and 465b satisfies $\phi_m > \chi + E_g/2$ and the barrier for holes ($\phi_{Bp}$) represented by ($\chi + E_g - \phi_m$) is less than 0.25 eV, so that holes are injected from the conductors of the source electrode layers 355a, 365a, 405a, and 465a, pass through the oxide semiconductor, and reach the conductors of the drain electrode layers 355b, 365b, 405b, and 465b, respectively. Thus, each of the transistors 350, 360, 450, and 460 can operate as a p-channel transistor.

As the conductors used for the source electrode layers 355a, 365a, 405a, and 465a and the drain electrode layers 355b, 365b, 405b, and 465b of the p-channel transistors 350, 360, 450, and 460, metal oxide such as tin oxide (SnO), LaCuOCh (Ch=chalcogen such as S or Se), $CuAO_2$ (A=B, Al, Ga, In, or the like), $SrCu_2O_2$, NiO, $Cu_2O$, or CuO can be used, for example. An impurity may be added in order to increase the conductivity of the metal oxide. For example, LaCuOCh to which Mg is added or NiO to which Li is added can be used. Note that the source electrode layers 355a, 365a, 405a, and 465a and the drain electrode layers 355b, 365b, 405b, and 465b can be formed by a sputtering method or a vacuum evaporation method.

A source electrode layer and a drain electrode layer in this specification are each a conductive film in contact with an oxide semiconductor layer. Therefore, in the case where a source electrode layer and a drain electrode layer are stacked, at least a conductive film in contact with an oxide semiconductor layer is formed using a conductor in which the work function ($\phi_m$) satisfies $\phi_m > \chi + E_g/2$ and the bather for holes ($\phi_{Bp}$) represented by ($\chi + E_g - \phi_m$) is less than 0.25 eV.

For example, in the case where a source electrode layer and a drain electrode layer are stacked as a first conductive film and a second conductive film in this order over the oxide semiconductor layer, the first conductive film in contact with the oxide semiconductor layer is formed using a conductor in which the work function ($\phi_m$) satisfies $\phi_m > \chi + E_g/2$ and the barrier for holes ($\phi_{Bp}$) represented by ($\chi + E_g - \phi_m$) is less than 0.25 eV. The second conductive film may be formed using another conductor. Conductive films such as the wiring layer 464a and the wiring layer 464b which are electrically connected to the source electrode layer 465a and the drain electrode layer 465b, respectively, can be formed using the same material as the second conductive film.

The second conductive film that is not in contact with the oxide semiconductor layer can be formed using an element selected from Al, Cr, Cu, Ta, Ti, Mo, and W, an alloy containing any of these elements as its component, an alloy film containing a combination of any of these elements, or the like. Alternatively, a structure may be employed in which a high-melting-point metal layer of Cr, Ta, Ti, Mo, W, or the like is stacked on one or both of a top surface and a bottom surface of a metal layer of Al, Cu, or the like. Alternatively, an Al material to which an element that prevents generation of hillocks or whisker in an Al film, such as Si, Ti, Ta, W, Mo, Cr, Nd, Sc, or Y is added may be used, so that heat resistance can be improved. Alternatively, a light-transmitting conductive material may be used for the second conductive film.

As the oxide semiconductor layers 352, 362, 403, and 452, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; or a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; an In—O-based film, a Sn—O-based film, or a Zn—O-based film can be used. In addition, the above oxide semiconductor layers may contain $SiO_2$.

As the oxide semiconductor layers 352, 362, 403, and 452, a thin film represented by $InMO_3 (ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is represented by $InMO_3 (ZnO)_m$ (m>0), which includes Ga as M, is referred to as the In—Ga—Zn—O-based oxide semiconductor, and a thin film of the In—Ga—Zn—O-based oxide semiconductor is also referred to as an In—Ga—Zn—O-based non-single-crystal film.

The oxide semiconductor layer can be formed by a sputtering method in a rare gas (typically, argon) atmosphere, an oxygen atmosphere, or a mixed atmosphere containing a rare gas (typically, argon) and oxygen.

It is preferable to use a high-purity gas from which an impurity such as hydrogen, water, a hydroxyl group, or hydride is removed so that the concentration is approximately several parts per million or approximately several parts per billion, as a sputtering gas used when the oxide semiconductor layer is formed.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

There are also a sputtering apparatus provided with a magnet system inside the chamber and used for a magnetron sputtering method, and a sputtering apparatus used for an ECR sputtering method in which plasma generated with the use of microwaves is used without using glow discharge.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

There is no particular limitation on a substrate that can be used as the substrate 320, 340, 400, or 470 having an insulating surface as long as it has at least heat resistance high enough to withstand heat treatment performed later. For example, a glass substrate of barium borosilicate glass, aluminoborosilicate glass, or the like can be used.

In the case where a glass substrate is used and the temperature at which the heat treatment performed later is high, a glass substrate whose strain point is greater than or equal to 730° C. is preferably used. As a glass substrate, a glass material such as aluminosilicate glass, aluminoborosilicate glass, or barium borosilicate glass is used, for example. A glass substrate in which the amount of barium oxide (BaO) is larger than that of boron oxide ($B_2O_3$), which is practical heat-resistance glass, may be used.

Note that instead of the glass substrate, a substrate formed of an insulator such as a ceramic substrate, a quartz substrate, or a sapphire substrate may be used. Alternatively, crystallized glass or the like may be used. Still alternatively, a plastic substrate or the like can be used as appropriate.

In the bottom-gate transistors 350, 360, 420, and 450, an insulating film serving as a base film may be provided between the substrate and the gate electrode layer. The base film has a function of preventing diffusion of an impurity element from the substrate, and can be formed to have a single-layer structure or a stacked structure using one or more of a silicon nitride film, a silicon oxide film, a silicon nitride oxide film, and a silicon oxynitride film.

The gate electrode layers 351, 361, 401, and 461 can be each formed as a single layer or a stacked layer using a metal material such as molybdenum, titanium, chromium, tantalum, tungsten, aluminum, copper, neodymium, or scandium or an alloy material containing any of these materials as its main component.

For example, as a two-layer structure of the gate electrode layers 351, 361, 401, and 461, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can be formed using a light-transmitting conductive film. As an example of a light-transmitting conductive film, a light-transmitting conductive oxide or the like is given.

The gate insulating layers 322, 342, 402, and 462 can be each formed to have a single-layer structure or a stacked structure of one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. It is preferable that the gate insulating layers 322, 342, 402, and 462 do not contain a large amount of hydrogen. In the case where a silicon oxide film is formed by a sputtering method, a silicon target or a quartz target is used as a target, and an oxygen gas or a mixed gas of oxygen and argon is used as a sputtering gas.

The gate insulating layers 322, 342, 402, and 462 may have a structure in which a silicon nitride layer and a silicon oxide layer are stacked from the gate electrode layer side. For example, a silicon nitride layer ($SiN_y$ (y>0)) with a thickness of greater than or equal to 50 nm and less than or equal to 200 nm is formed by a sputtering method as a first gate insulating layer, and a silicon oxide layer ($SiO_x$ (x>0)) with a thickness of greater than or equal to 5 nm and less than or equal to 300 nm is stacked as a second gate insulating layer over the first gate insulating layer; thus, a gate insulating layer with a thickness of 100 nm may be formed. The thickness of the gate insulating layers 322, 342, 402, and 462 may be set as appropriate depending on the desired characteristics of the thin film transistor. The thickness may be approximately 350 nm to 400 nm.

Further, in order that hydrogen, a hydroxyl group, and moisture might be contained in the gate insulating layers 322, 342, 402, and 462 and the oxide semiconductor layers 352, 362, 403, and 452 as little as possible, it is preferable that the substrate over which the gate electrode layer is formed or the substrate over which layers up to the gate insulating layer are formed be preheated in a preheating chamber of a sputtering apparatus as pretreatment for film formation so that impurities such as hydrogen and moisture adsorbed to the substrate is eliminated. Note that as an exhaustion unit provided in the preheating chamber, a cryopump is preferably used. The preheating treatment can be omitted. Alternatively, the preheating treatment may be performed on the substrate over which layers up to and including the source electrode layer and the drain electrode layer are formed, before the insulating layers 356, 366, 407, and 457 are formed.

The insulating layers 356, 366, 407, and 457 can be each formed to a thickness of at least 1 nm by a method by which an impurity such as water or hydrogen does not enter the insulating layers 356, 366, 407, and 457, such as a sputtering method as appropriate. When hydrogen is contained in the insulating layers 356, 366, 407, and 457, entry of the hydrogen to the oxide semiconductor layer or extraction of oxygen in the oxide semiconductor layer by hydrogen may occur, thereby causing the backchannel of the oxide semiconductor layer to have lower resistance (to be n-type), so that a parasitic channel may be formed. Therefore, it is important that a formation method in which hydrogen is not used is employed so that the oxide insulating layers 356, 366, 407, and 457 containing as little hydrogen as possible are formed.

In this embodiment, a 200-nm-thick silicon oxide film is deposited as the insulating layers 356, 366, 407, and 457 by a sputtering method. The substrate temperature at the time of film deposition may be greater than or equal to room temperature and less than or equal to 300° C., and in this embodiment, is 100° C. The silicon oxide film can be formed by a sputtering method in a rare gas (typically, argon) atmosphere, an oxygen atmosphere, or a mixed atmosphere containing a rare gas (typically, argon) and oxygen. As a target, a silicon oxide target or a silicon target can be used. For example, with the use of a silicon target, silicon oxide can be deposited by a sputtering method in an atmosphere of oxygen and nitrogen.

The insulating layers 356, 366, 407, and 457 are formed using an inorganic insulating film which does not include impurities such as moisture, a hydrogen ion, or OH⁻. Typically, a silicon oxide film, a silicon oxynitride film, an aluminum oxide film, an aluminum oxynitride film, or the like is used.

In that case, it is preferable to remove residual moisture in the chamber in the deposition of the insulating layers 356, 366, 407, and 457. This is in order to prevent the oxide semiconductor layers 352, 362, 403, and 452 and the insulating layers 356, 366, 407, and 457 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the insulating layers 356, 366, 407, and 457 formed in the chamber can be reduced.

It is preferable to use a high-purity gas from which an impurity such as hydrogen, water, a hydroxyl group, or hydride is removed so that the concentration is approximately several parts per million or approximately several parts per billion, as a sputtering gas used when the insulating layers 356, 366, 407, and 457 are formed.

When a silicon oxide layer having a lot of defects is used as the oxide insulating layer, by this heat treatment after the silicon oxide layer is formed, an impurity such as hydrogen, moisture, a hydroxyl group, or hydride contained in the oxide semiconductor layer can be diffused to the oxide insulating layer so that the impurity in the oxide semiconductor layer can be further reduced.

As the protective insulating layers 323, 343, and 409, an inorganic insulating film which does not contain an impurity such as moisture, a hydrogen ion, or OH⁻ and blocks the entry of such an impurity from the outside is used; a silicon nitride film, an aluminum nitride film, a silicon nitride oxide film, an aluminum nitride oxide film, or the like is used. For example, a silicon nitride film is formed by an RF sputtering method. An RF sputtering method is preferable as a method for forming the protective insulating layers 323, 343, and 409 because it has high productivity.

Accordingly, p-channel transistors with a variety of structures can be obtained under the following conditions: the work function ($\phi_m$) of the conductor used for the source electrode layer and the drain electrode layer is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV.

Therefore, a highly functional and highly reliable semiconductor device in which a p-channel transistor and an n-channel transistor which include an oxide semiconductor are included and both polarities of the n-channel transistor and the p-channel transistor are used can be provided.

In this embodiment, an example of a complementary metal oxide semiconductor (CMOS) structure of an n-channel transistor including an oxide semiconductor and a p-channel transistor including an oxide semiconductor, and an example of a manufacturing method of the CMOS structure will be described.

A process for manufacturing a transistor 510 serving as a p-channel transistor and a transistor 520 serving as an n-channel transistor over a substrate 500 will be described below with reference to FIGS. 12A to 12E.

First, a conductive film is formed over the substrate 500 having an insulating surface, and then, gate electrode layers 511 and 521 are formed in a first photolithography step.

An insulating film serving as a base film may be provided between the substrate 500 and the gate electrode layers 511 and 521.

The gate electrode layers 511 and 521 can be formed as a single layer or a stacked layer using a metal material such as molybdenum, titanium, chromium, tantalum, tungsten, aluminum, copper, neodymium, or scandium or an alloy material containing any of these materials as its main component.

Next, a gate insulating layer 502 is formed over the gate electrode layers 511 and 521. The gate insulating layer 502 can be formed to have a single-layer structure or a stacked structure of a silicon oxide layer, a silicon nitride layer, a silicon oxynitride layer, a silicon nitride oxide layer, or an aluminum oxide layer by a plasma CVD method, a sputtering method, or the like. It is preferable that the gate insulating layer 502 do not include a large amount of hydrogen.

Then, an oxide semiconductor film is formed to a thickness of greater than or equal to 2 nm and less than or equal to 200 nm over the gate insulating layer 502. Note that the appropriate thickness of the oxide semiconductor film depends on an oxide semiconductor material, and the thickness may be set as appropriate depending on the material. In this embodiment, the oxide semiconductor film is formed using an In—Ga—Zn—O-based oxide target by a sputtering method.

The temperature of the first heat treatment is greater than or equal to 400° C. and less than or equal to 750° C., preferably greater than or equal to 400° C. and less than the strain point of the substrate. Here, the substrate is put in an electric furnace that is a kind of heat treatment apparatus and the oxide semiconductor film is subjected to heat treatment in a nitrogen atmosphere at 450° C. for one hour, and then, water or hydrogen is prevented from being mixed into the oxide semiconductor film; thus, an oxide semiconductor film 530 is obtained (see FIG. 12A).

Figure 12A:
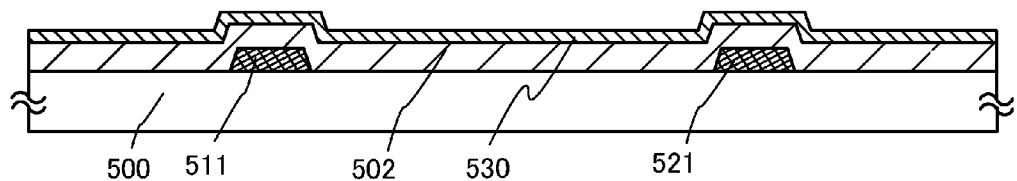
FIGS. 12A to 12E are views illustrating a manufacturing method of a semiconductor device.
Figure 12B:
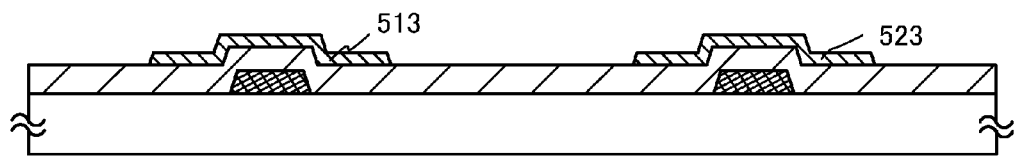
Figure 12C:
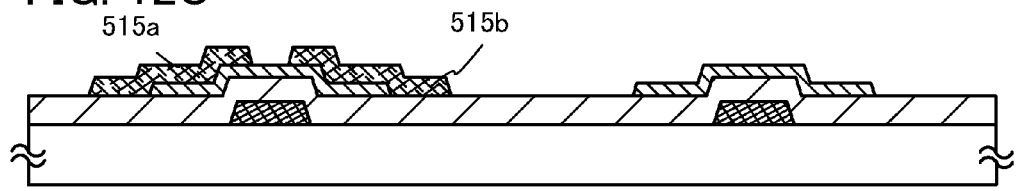
Figure 12D:
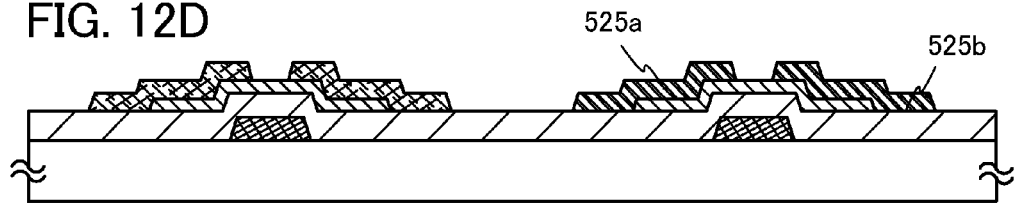
Figure 12E:
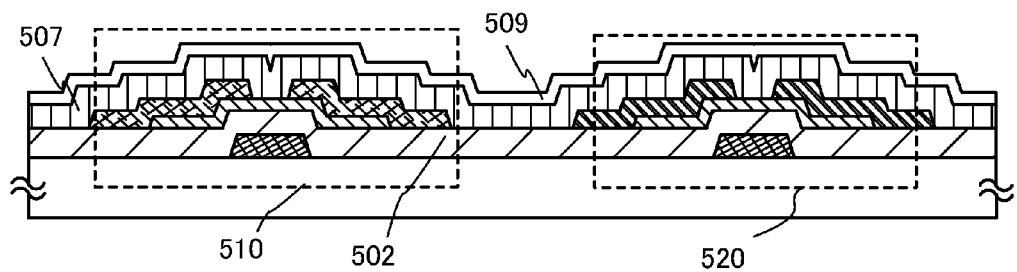

Next, the oxide semiconductor film 530 is processed into island-shaped oxide semiconductor layers 513 and 523 in a second photolithography step (see FIG. 12B). The heat treatment for dehydration or dehydrogenation may be performed after the oxide semiconductor film is processed into island-shaped oxide semiconductor layers.

The oxide semiconductor layer 513 is used as a semiconductor layer of a p-channel transistor and the oxide semiconductor layer 523 is used as a semiconductor layer of an n-channel transistor. The oxide semiconductor layers 513 and 523 can be formed using the same material in the same step, as described in this embodiment.

Next, a conductive film is formed over the oxide semiconductor layer 513, and a resist mask is formed in a third photolithography step. Then, selective etching is performed so that a source electrode layer 515a and a drain electrode layer 515b are formed (see FIG. 12C).

The work function ($\phi_m$) of the conductor used for the source electrode layer 515a and the drain electrode layer 515b satisfies $\phi_m > \chi + E_g/2$ and the barrier for holes ($\phi_{Bp}$) represented by ($\chi + E_g - \phi_m$) is less than 0.25 eV, so that holes are injected from the conductor of the source electrode layer 515a, pass through the oxide semiconductor, and reach the conductor of the drain electrode layer 515b. Thus, the transistor 510 can operate as a p-channel transistor.

The source electrode layer 515a and the drain electrode layer 515b may be formed by a sputtering method or a vacuum evaporation method. As a material for the source electrode layer 515a and the drain electrode layer 515b, metal oxide such as tin oxide (SnO), LaCuOCh (Ch=chalcogen such as S or Se), CuAO$_2$ (A=B, Al, Ga, In, or the like), SrCu$_2$O$_2$, NiO, Cu$_2$O, or CuO can be used, for example. An impurity may be added in order to increase the conductivity of the metal oxide. For example, LaCuOCh to which Mg is added or NiO to which Li is added can be used.

On the other hand, a conductive film serving as the source electrode layer 525a and the drain electrode layer 525b is formed over the oxide semiconductor layer 523. The conductive film may be formed by a sputtering method or a vacuum evaporation method. A resist mask is formed over the conductive film in a fourth photolithography step. Then, selective etching is performed so that the source electrode layer 525a and the drain electrode layer 525b are formed, and after that, the resist mask is removed (see FIG. 12D).

As a material for the source electrode layer 525a and the drain electrode layer 525b, an element selected from Al, Cr, Cu, Ta, Ti, Mo, and W, an alloy containing any of these elements as its component, an alloy film containing a combination of any of these elements, and the like are given. Alternatively, a structure may be employed in which a high-melting-point metal layer of Cr, Ta, Ti, Mo, W, or the like is stacked on one or both of a top surface and a bottom surface of a metal layer of Al, Cu, or the like. Alternatively, an Al material to which an element that prevents generation of hillocks or whisker in an Al film, such as Si, Ti, Ta, W, Mo, Cr, Nd, Sc, or Y is added may be used, so that heat resistance can be improved. In this embodiment, a titanium film is used as the source electrode layer 525a and the drain electrode layer 525b.

The source electrode layer 525a and the drain electrode layer 525b may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are sequentially stacked, and the like are given.

In the case where heat treatment is performed after the formation of the source electrode layer 525a and the drain electrode layer 525b, the conductive film preferably has heat resistance high enough to withstand the heat treatment.

Note that in this embodiment, an In—Ga—Zn—O-based oxide semiconductor layer is used as the oxide semiconductor layers 513 and 523. The electron affinity ($\chi$) of the In—Ga—Zn—O-based oxide semiconductor is 4.3 eV, and the energy gap ($E_g$) thereof is 3.15 eV.

Next, an insulating layer 507 serving as a protective insulating film is formed over the oxide semiconductor layers 513 and 523, the source electrode layers 515a and 525a, and the drain electrode layers 515b and 525b. The insulating layer 507 can be formed by a method by which an impurity such as water or hydrogen does not enter the insulating layer 507, such as a sputtering method as appropriate. In this embodiment, a 200-nm-thick silicon oxide film is formed as the insulating layer 507 by a sputtering method.

Then, the second heat treatment is performed in an inert gas atmosphere or an oxygen gas atmosphere (preferably at 200 to 400° C., e.g., at 250 to 350° C.). For example, the second heat treatment is performed in a nitrogen atmosphere at 250° C. for one hour. In the second heat treatment, heat is applied while part of the oxide semiconductor layer (the channel formation region) is in contact with the insulating layer 507.

Through the above steps, the following can be achieved: in order to prevent variation in electric characteristics of the transistor to the formed, impurities such as hydrogen, moisture, a hydroxyl group, or hydride (also referred to as a hydrogen compound) which cause the variation can be removed from the oxide semiconductor layer; and the oxide semiconductor layers 513 and 523 can be highly purified to become electrically i-type (intrinsic) by supplying oxygen which is a major component of an oxide semiconductor, which is simultaneously reduced in a step of removing impurities.

A protective insulating layer may be provided over the insulating layer 507. In this embodiment, a protective insulating layer 509 is formed over the insulating layer 507. As the protective insulating layer 509, a silicon nitride film, a silicon nitride oxide film, an aluminum nitride film, an aluminum nitride oxide film, or the like is used. In this embodiment, a 100-nm-thick silicon nitride film is formed as the protective insulating layer 509 by a sputtering method.

Accordingly, the transistor 510 that is a p-channel transistor according to this embodiment can be obtained under the following conditions: the work function ($\phi_m$) of the conductor used for the source electrode layer 515a and the drain electrode layer 515b is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV. On the other hand, with the use of the source electrode layer 525a and the drain electrode layer 525b which are formed using a conductor having a different work function that does not satisfy the condition of the source electrode layer and the drain electrode layer of the p-channel transistor, the transistor 520 can be an n-channel transistor. Thus, the semiconductor device having a CMOS structure which includes the transistors 510 and 520 each including an oxide semiconductor layer can be manufactured (see FIG. 12E).

The oxide semiconductor layer used in this specification functions as a path through which a carrier passes without being defined as an n-type oxide semiconductor layer or a p-type oxide semiconductor layer. The n-channel transistor and the p-channel transistor can be manufactured using the same material of an i-type (intrinsic) oxide semiconductor layer. The work function ($\phi_m$) of the conductor used for the source electrode layer and the drain electrode layer in contact with the oxide semiconductor layer is controlled, so that the n-channel transistor and the p-channel transistor can be separately formed. Accordingly, the n-channel transistor and the p-channel transistor can be manufactured as follows: the source electrode layer and the drain electrode layer of the n-channel transistor are formed using a different material in a different step from those of the p-channel transistor, and the gate electrode layer, the gate insulating layer, the oxide semiconductor layer, and the like of the n-channel transistor can be formed using the same material as those of the p-channel transistor. The CMOS structure can be manufactured without complicating the manufacturing process, leading to advantages in productivity and cost.

Therefore, a highly functional and highly reliable semiconductor device in which a p-channel transistor and an n-channel transistor which include an oxide semiconductor are included and both polarities of the n-channel transistor and the p-channel transistor are used can be provided.

This embodiment can be implemented in combination with any of the other embodiments, as appropriate.

(Embodiment 4)

Figure 11:
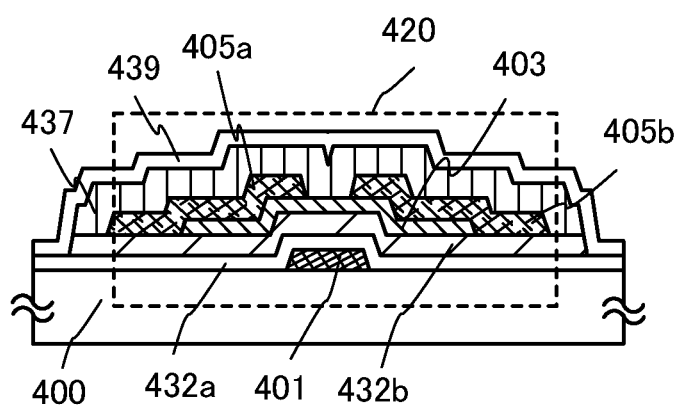
FIG. 11 is a view illustrating a semiconductor device.

In this embodiment, FIG. 11 illustrates an example in which an oxide semiconductor layer is surrounded by nitride insulating layers when seen in cross section. A transistor illustrated in FIG. 11 is the same as the transistor 450 described in Embodiment 2 except for the top surface shape and the positions of end portions of an insulating layer, and the structure of the gate insulating layer. The same portion as or a portion having a function similar to those in Embodiment 2 can be formed in a manner similar to that described in Embodiment 2, and also the steps similar to those in Embodiment 2 can be performed in a manner similar to that described in Embodiment 2; thus, repetitive description is omitted.

A transistor 420 illustrated in FIG. 11 is a bottom-gate thin film transistor and includes, over the substrate 400 having an insulating surface, the gate electrode layer 401, a gate insulating layer 432a using a nitride insulating layer, a gate insulating layer 432b using an oxide insulating layer, the oxide semiconductor layer 403, the source electrode layer 405a, and the drain electrode layer 405b. An insulating layer 437 using an oxide insulating layer that covers the transistor 420 is stacked over the oxide semiconductor layer 403. A protective insulating layer 439 using a nitride insulating layer is formed over the insulating layer 437. The protective insulating layer 439 is in contact with the gate insulating layer 432a that is formed using a nitride insulating layer.

In the transistor 420, the gate insulating layer has a stacked structure in which a nitride insulating layer and an oxide insulating layer are stacked in this order over the gate electrode layer. The insulating layer 437 and the gate insulating layer 432b are selectively etched before formation of the protective insulating layer 439 that is formed using a nitride insulating layer so that the gate insulating layer 432a that is formed using a nitride insulating layer is exposed.

When seen from the above, at least the area of the insulating layer 437 and the area of the gate insulating layer 432b are preferably larger than the area of the oxide semiconductor layer 403, and the insulating layer 437 and the gate insulating layer 432b preferably cover the transistor 420.

Further, the protective insulating layer 439 that is formed using a nitride insulating layer is formed so as to cover the top surface of the insulating layer 437 and the side surfaces of the insulating layer 437 and the gate insulating layer 432b and be in contact with the gate insulating layer 432a that is formed using a nitride insulating layer.

For the protective insulating layer 439 and the gate insulating layer 432a which are each formed using a nitride insulating layer, an inorganic insulating film which does not include impurities such as moisture, a hydrogen ion, and ($\phi_m$) and which prevents the entry of them from the outside is used: for example, a silicon nitride film, a silicon oxynitride film, an aluminum nitride film, or an aluminum oxynitride film obtained by a sputtering method or a plasma CVD method is used.

In this embodiment, for example, as the protective insulating layer 439 formed using a nitride insulating layer, a 100-nm-thick silicon nitride layer is formed by an RF sputtering method to cover the bottom surface, the top surface, and side surface of the oxide semiconductor layer 403.

With the structure illustrated in FIG. 11, an impurity such as hydrogen, moisture, a hydroxyl group, or hydride in the oxide semiconductor layer is reduced due to the gate insulating layer 432b and the insulating layer 437 which are provided to surround and be in contact with the oxide semiconductor layer, and the entry of moisture from the outside in a manufacturing process after the formation of the protective insulating layer 439 can be prevented because the oxide semiconductor layer is further surrounded by the gate insulating layer 432a and the protective insulating layer 439 which are each formed using a nitride insulating layer. Moreover, the entry of moisture from the outside can be prevented in the long term even after the device is completed as a semiconductor device, for example; thus, the long-term reliability of the device can be improved.

In this embodiment, one transistor is surrounded by nitride insulating layers; however, the embodiment of the present invention is not limited to this structure. A plurality of transistors may be surrounded by nitride insulating layers, or a plurality of transistors in a pixel portion may be surrounded by nitride insulating layers. A region where the protective insulating layer 439 and the gate insulating layer 432a are in contact with each other may be formed so as to surround a pixel portion of an active matrix substrate.

Accordingly, the p-channel transistor according to this embodiment can be obtained under the following conditions: the work function ($\phi_m$) of the conductor used for the source electrode layer and the drain electrode layer is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV.

Therefore, a highly functional and highly reliable semiconductor device in which a p-channel transistor and an n-channel transistor which include an oxide semiconductor are included and both polarities of the n-channel transistor and the p-channel transistor are used can be provided.

This embodiment can be implemented in combination with any of the structures of the other embodiments, as appropriate.

(Embodiment 5)

In this embodiment, an example of a p-channel transistor including an oxide semiconductor layer and an example of a manufacturing method of the p-channel transistor will be described in detail with reference to FIGS. 13A to 13E. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. Detailed description of the same portions is also omitted.

FIG. 13A to 13E illustrate an example of a cross-sectional structure of a transistor. A transistor 390 illustrated in FIGS. 13A to 13E is one of bottom-gate thin film transistors and is also referred to as an inverted staggered thin film transistor.

Although description is given using single-gate transistors as the transistor 390, a multi-gate transistor including a plurality of channel formation regions may be formed as needed.

A manufacturing process of the transistor 390 over a substrate 394 will be described below with reference to FIGS. 13A to 13E.

First, a conductive film is formed over the substrate 394 having an insulating surface, and then, a gate electrode layer 391 is formed in a first photolithography step. It is preferable that an end portion of the formed gate electrode layer have a tapered shape because coverage with the gate insulating layer stacked thereover is improved. Note that a resist mask may be formed by an inkjet method. Formation of the resist mask by an inkjet method needs no photomask; thus, manufacturing cost can be reduced.

There is no particular limitation on a substrate that can be used as the substrate 394 having an insulating surface as long as it has at least heat resistance high enough to withstand heat treatment performed later. For example, a glass substrate of barium borosilicate glass, aluminoborosilicate glass, or the like can be used.

In the case where a glass substrate is used and the temperature at which the heat treatment performed later is high, a glass substrate whose strain point is greater than or equal to 730° C. is preferably used. As a glass substrate, a glass material such as aluminosilicate glass, aluminoborosilicate glass, or barium borosilicate glass is used, for example.

Note that instead of the glass substrate, a substrate formed of an insulator such as a ceramic substrate, a quartz substrate, or a sapphire substrate may be used. Alternatively, crystallized glass or the like may be used. Still alternatively, a plastic substrate or the like can be used as appropriate.

An insulating film serving as a base film may be provided between the substrate 394 and the gate electrode layer 391. The base film has a function of preventing diffusion of an impurity element from the substrate 394, and can be formed to have a single-layer structure or a stacked structure using one or more of a silicon nitride film, a silicon oxide film, a silicon nitride oxide film, and a silicon oxynitride film.

The gate electrode layer 391 can be formed as a single layer or a stacked layer using a metal material such as molybdenum, titanium, chromium, tantalum, tungsten, aluminum, copper, neodymium, or scandium or an alloy material containing any of these materials as its main component.

For example, as a two-layer structure of the gate electrode layer 391, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, a two-layer structure of a tungsten nitride layer and a tungsten layer. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can be formed using a light-transmitting conductive film. As an example of a light-transmitting conductive film, a light-transmitting conductive oxide or the like is given.

Then, a gate insulating layer 397 is formed over the gate electrode layer 391.

The gate insulating layer 397 can be formed to have a single-layer structure or a stacked structure of one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. In the case where a silicon oxide film is formed by a sputtering method, a silicon target or a quartz target is used as a target, and an oxygen gas or a mixed gas of oxygen and argon is used as a sputtering gas.

Here, the oxide semiconductor that is made to be i-type or a substantially i-type (the oxide semiconductor that is highly purified) by removal of an impurity is extremely sensitive to an interface state and an interface electric charge; thus, the interface between the oxide semiconductor and the gate insulating layer is important. Therefore, the gate insulating layer (GI) that is in contact with the highly-purified oxide semiconductor needs to have higher quality.

For example, high-density plasma CVD using a microwave (2.45 GHz) is preferably used, in which case an insulating layer which is dense, has high withstand voltage, and has high quality can be formed. The highly-purified oxide semiconductor and the high-quality gate insulating layer are in close contact with each other, whereby the interface state can be reduced to obtain favorable interface characteristics.

Another film formation method such as a sputtering method or a plasma CVD method can be employed as long as the method enables formation of a good-quality insulating layer as a gate insulating layer. Further, an insulating layer whose film quality and characteristic of the interface between the insulating layer and an oxide semiconductor are improved by heat treatment which is performed after formation of the insulating layer may be formed as a gate insulating layer. In any case, any insulating layer may be used as long as the insulating layer has characteristics of enabling reduction in interface state density of the interface between the insulating layer and an oxide semiconductor and formation of a favorable interface as well as having favorable film quality as a gate insulating layer.

Further, when an oxide semiconductor containing an impurity is subjected to a gate bias-temperature stress test (BT test) for 12 hours under conditions that the temperature is 85° C. and the voltage applied to the gate is $2 \times 10^6$ V/cm, a bond between the impurity and a main component of the oxide semiconductor is cleaved by a high electric field (B: bias) and a high temperature (T: temperature), and a generated dangling bond induces drift of threshold voltage ($V_{th}$).

In contrast, the invention disclosed in this specification makes it possible to obtain a transistor which is stable to a BT test by removal of an impurity in an oxide semiconductor, especially hydrogen, water, or the like as much as possible to obtain a favorable characteristic of the interface between the oxide semiconductor film and a gate insulating layer as described above.

The gate insulating layer 397 may have a structure in which a nitride insulating layer and an oxide insulating layer are stacked from the gate electrode layer 391 side. For example, a silicon nitride layer ($SiN_y$ (y>0)) with a thickness of greater than or equal to 50 nm and less than or equal to 200 nm is formed by a sputtering method as a first gate insulating layer, and a silicon oxide layer ($SiO_x$ (x>0)) with a thickness of greater than or equal to 5 nm and less than or equal to 300 nm is stacked as a second gate insulating layer over the first gate insulating layer; thus, a gate insulating layer with a thickness of 100 nm may be formed. The thickness of the gate insulating layer may be set as appropriate depending on the desired characteristics of the transistor. The thickness may be approximately 350 nm to 400 nm.

Further, in order that hydrogen, a hydroxyl group, and moisture might be contained in the gate insulating layer 397 and the oxide semiconductor film 393 as little as possible, it is preferable that the substrate 394 over which the gate electrode layer 391 is formed or the substrate 394 over which layers up to the gate insulating layer 397 are formed be preheated in a preheating chamber of a sputtering apparatus as pretreatment for film formation so that impurities such as hydrogen and moisture adsorbed to the substrate 394 is eliminated. Note that preheating temperature is greater than or equal to 100° C. and less than or equal to 400° C., preferably, greater than or equal to 150° C. and less than or equal to 300° C. As an exhaustion unit provided in the preheating chamber, a cryopump is preferably used. The preheating treatment can be omitted. The preheating treatment may be performed on the substrate 394 over which layers up to and including the source electrode layer 395a and the drain electrode layer 395b are formed, before the insulating layer 396 is formed.

Figure 13A:
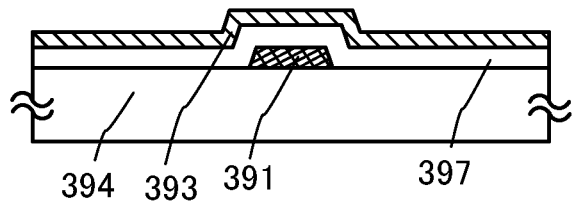
FIGS. 13A to 13E are views illustrating a manufacturing method of a semiconductor device.

Then, an oxide semiconductor film 393 is formed to a thickness of greater than or equal to 2 nm and less than or equal to 200 nm over the gate insulating layer 397 (see FIG. 13A).

Note that before the oxide semiconductor film 393 is formed by a sputtering method, powdery substances (also referred to as particles or dust) attached on a surface of the gate insulating layer 397 are preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate so that a substrate surface is modified. Note that instead of an argon atmosphere, a nitrogen atmosphere, a helium atmosphere, an oxygen atmosphere, or the like may be used.

The oxide semiconductor film 393 is formed by a sputtering method. As the oxide semiconductor film 393, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; or a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; an In—O-based film, a Sn—O-based film, or a Zn—O-based film can be used. In addition, the above oxide semiconductor film may contain $SiO_2$. In this embodiment, the oxide semiconductor film 393 is formed using an In—Ga—Zn—O-based oxide semiconductor target by a sputtering method. The oxide semiconductor film 393 can be formed in a rare gas (typically, argon) atmosphere, an oxygen atmosphere, or a mixed atmosphere containing a rare gas (typically, argon) and oxygen by a sputtering method.

As a target for forming the oxide semiconductor film 393 by a sputtering method, a metal oxide target containing zinc oxide as its main component can be used. As another example of a metal oxide target, an oxide target containing In, Ga, and Zn (in a composition ratio, $In_2O_3$:$Ga_2O_3$: ZnO=1:1:1 [molar ratio], or In:Ga:Zn=1:1:0.5 [atomic ratio]) can be used. In addition, as the oxide target containing In, Ga, and Zn, a target having a composition ratio of In:Ga:Zn=1:1:1 [atomic ratio] or In:Ga:Zn=1:1:2 [atomic ratio] can be used. The fill rate of the oxide target is greater than or equal to 90% and less than or equal to 100%, preferably, greater than or equal to 95% and less than or equal to 99.9%. With the use of the oxide target with high fill rate, a dense oxide semiconductor film is formed.

The substrate is held in the chamber which is kept in a reduced-pressure state, and the substrate is heated to a room temperature or a temperature of less than 400° C. Then, a sputtering gas from which hydrogen and moisture are removed is introduced into the chamber from which residual moisture is being removed, and an oxide semiconductor film 393 is deposited over the substrate 394 with use of a metal oxide as a target. In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like (preferably, a compound including a carbon atom as well), for example, is exhausted. Accordingly, the concentration of impurities included in the oxide semiconductor film formed in the chamber can be reduced.

As an example of the deposition condition, the distance between the substrate and the target is 100 mm, the pressure is 0.6 Pa, the direct-current (DC) power source is 0.5 kW, and the atmosphere is an oxygen atmosphere (the proportion of oxygen flow is 100%). Note that a pulse direct-current (DC) power source is preferable because powdery substances (also referred to as particles or dust) generated in the film formation can be reduced and the film thickness can be uniform. The thickness of the oxide semiconductor film is preferably greater than or equal to 5 nm and less than or equal to 30 nm Note that an appropriate thickness differs depending on an oxide semiconductor material, and the thickness may be set as appropriate depending on the material.

Figure 13B:
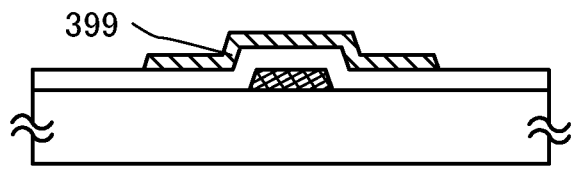
Figure 13C:
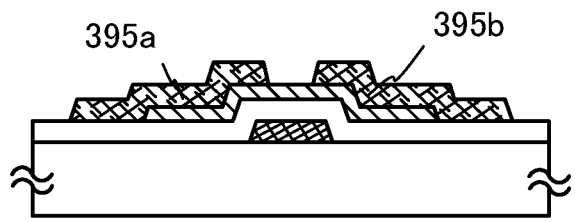

Then, the oxide semiconductor film is processed into an island-shaped oxide semiconductor layer 399 by a second photolithography step (see FIG. 13B). A resist mask used for forming the island-shaped oxide semiconductor layer 399 may be formed by an inkjet method. Formation of the resist mask by an inkjet method needs no photomask; thus, manufacturing cost can be reduced.

In the case where a contact hole is formed in the gate insulating layer 397, the step can be formed at the time of formation of the oxide semiconductor layer 399.

Note that the etching of the oxide semiconductor film 393 may be dry etching, wet etching, or both dry etching and wet etching.

As an etching gas used for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the films into desired shapes, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a solution obtained by mixing phosphoric acid, acetic acid, and nitric acid, an ammonia peroxide mixture (hydrogen peroxide water at 31 wt %: ammonia water at 28 wt %: water=5:2:2), or the like can be used. In addition, ITO-07N (produced by KANTO CHEMICAL CO., INC.) may also be used.

The etchant used in the wet etching is removed by cleaning together with the material which is etched off. Waste liquid of the etchant containing the removed material may be purified and the material contained in the waste liquid may be reused. When a material such as indium contained in the oxide semiconductor layer is collected from the waste liquid after the etching and is reused, the resources can be efficiently used and the cost can be reduced.

In order to etch the film into a desired shape, etching conditions (e.g., etchant, etching time, temperature, or the like) are controlled as appropriate depending on the material.

Note that reverse sputtering is preferably performed before formation of a conductive film in a subsequent step, so that a resist residue attached to surfaces of the oxide semiconductor layer 399 and the gate insulating layer 397 is removed.

The work function ($\phi_m$) of the conductor used for the source electrode layer and the drain electrode layer (including a wiring which is formed of the same layer as the source and the drain electrode layer) satisfies $\phi_m > \chi + E_g/2$ and the barrier for holes ($\phi_{Bp}$) represented by ($\chi + E_g - \phi_m$) is less than 0.25 eV, so that holes are injected from the conductor of the source electrode layer, pass through the oxide semiconductor, and reach the conductor of the drain electrode layer. Thus, the transistor can operate as a p-channel transistor.

A conductive film is formed over the gate insulating layer 397 and the oxide semiconductor layer 399. The conductive film may be formed by a sputtering method or a vacuum evaporation method. As a material for a conductive film serving as the source electrode layer and the drain electrode layer, metal oxide such as tin oxide (SnO), LaCuOCh (Ch=chalcogen such as S or Se), CuAO$_2$ (A=B, Al, Ga, In, or the like), SrCu$_2$O$_2$, NiO, Cu$_2$O, or CuO can be used, for example. An impurity may be added in order to increase the conductivity of the metal oxide. For example, LaCuOCh to which Mg is added or NiO to which Li is added can be used.

A source electrode layer and a drain electrode layer in this specification are each a conductive film in contact with an oxide semiconductor layer. Therefore, in the case where a source electrode layer and a drain electrode layer are stacked, at least a conductive film in contact with an oxide semiconductor layer is formed using a conductor in which the work function ($\phi_m$) satisfies $\phi_m > \chi + E_g/2$ and the barrier for holes ($\phi_{Bp}$) represented by ($\chi + E_g - \phi_m$) is less than 0.25 eV.

For example, in the case where a source electrode layer and a drain electrode layer are stacked as a first conductive film and a second conductive film in this order over the oxide semiconductor layer, the first conductive film in contact with the oxide semiconductor layer is formed using a conductor in which the work function ($\phi_m$) satisfies $\phi_m > \chi + E_g/2$ and the barrier for holes ($\phi_{Bp}$) represented by ($\chi + E_g - \phi_m$) is less than 0.25 eV. The second conductive film may be formed using another conductor.

The second conductive film that is not in contact with the oxide semiconductor layer can be formed using an element selected from Al, Cr, Cu, Ta, Ti, Mo, and W, an alloy containing any of these elements as its component, an alloy film containing a combination of any of these elements, or the like. Alternatively, a structure may be employed in which a high-melting-point metal layer of Cr, Ta, Ti, Mo, W, or the like is stacked on one or both of a top surface and a bottom surface of a metal layer of Al, Cu, or the like. Alternatively, an Al material to which an element that prevents generation of hillocks or whisker in an Al film, such as Si, Ti, Ta, W, Mo, Cr, Nd, Sc, or Y is added may be used, so that heat resistance can be improved. Alternatively, a light-transmitting conductive material may be used for the second conductive film.

A resist mask is formed over the conductive film in a third photolithography step. Then, selective etching is performed so that a source electrode layer 395a and a drain electrode layer 395b are formed, and after that, the resist mask is removed (see FIG. 13C).

Ultraviolet, a KrF laser beam, or an ArF laser beam is used for light exposure for forming the resist mask in the third photolithography step. The channel length L of a transistor to be formed is determined by a pitch between a lower end of the source electrode layer and a lower end of the drain electrode layer, which are adjacent to each other over the oxide semiconductor layer 399. Note that when light exposure is performed in the case where the channel length L is shorter than 25 nm, extreme ultraviolet with extremely short wavelengths of several nanometers to several tens of nanometers is used for light exposure for forming the resist mask in the third photolithography step. In light exposure using extreme ultraviolet, resolution is high and depth of focus is large. Thus, the channel length L of the transistor to be formed later can be more than or equal to 10 nm and less than or equal to 1000 nm and the operation speed of a circuit can be increased, and furthermore the value of off-state current is extremely small, and thus lower power consumption can be achieved.

Materials of the layers and etching conditions are adjusted as appropriate so that the oxide semiconductor layer 399 is not removed in etching of the conductive film.

Note that, in the third photolithography step, only part of the oxide semiconductor layer 399 is etched, whereby an oxide semiconductor layer having a groove (a depressed portion) is formed in some cases. Further, the resist mask for forming the source electrode layer 395a and the drain electrode layer 395b may be formed by an inkjet method. Formation of the resist mask by an inkjet method needs no photomask; thus, manufacturing cost can be reduced.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed with one multi-tone mask. Thus, the number of light-exposure masks can be reduced and the number of corresponding photolithography steps can be also reduced, whereby simplification of a process can be realized.

With plasma treatment with a gas such as N$_2$O, N$_2$, or Ar, water adsorbed to a surface of an exposed portion of the oxide semiconductor layer may be removed. In addition, plasma treatment may be performed using a mixed gas of oxygen and argon.

Figure 13D:
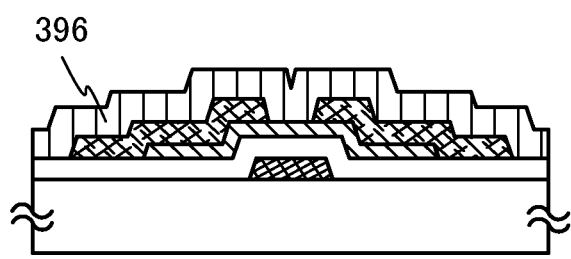

In the case where the plasma treatment is performed, the insulating layer 396 is formed without exposure to the atmosphere as an oxide insulating layer which serves as a protective insulating film in contact with part of the oxide semiconductor layer (see FIG. 13D). In this embodiment, in a region where the oxide semiconductor layer 399 overlaps with neither the source electrode layer 395a nor the drain electrode layer 395b, the oxide semiconductor layer 399 and the insulating layer 396 are formed in contact with each other.

In this embodiment, as the insulating layer 396, a silicon oxide layer including a defect is formed in the following manner: the substrate 394 over which layers up to the island-shaped oxide semiconductor layer 399, the source electrode layer 395a, and the drain electrode layer 395b are formed is heated to a room temperature or a temperature of less than 100° C.; a sputtering gas containing high-purity oxygen from which hydrogen and moisture are removed is introduced; and a silicon semiconductor target is used.

For example, a silicon oxide film is formed by a pulse DC sputtering method under the following condition: a boron-doped silicon target having a purity of 6N (resistivity: 0.01 Ωcm) is used; the distance between the target and the substrate (the T-S distance) is 89 mm; the pressure is 0.4 Pa; the direct-current (DC) power source is 6 kW; and the atmosphere is an oxygen atmosphere (the proportion of the oxygen flow is 100%). The film thickness is 300 nm Note that instead of a silicon target, quartz (preferably, synthetic quartz) can be used as the target for forming the silicon oxide film. Note that oxygen or a mixed gas of oxygen and argon is used as a sputtering gas.

In that case, it is preferable to remove residual moisture in the chamber in the deposition of the insulating layer 396. This is in order to prevent the oxide semiconductor layer 399 and the insulating layer 396 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the insulating layer 396 formed in the chamber can be reduced.

Note that as the insulating layer 396, a silicon oxynitride layer, an aluminum oxide layer, an aluminum oxynitride layer, or the like may be used instead of the silicon oxide layer.

Further, heat treatment may be performed at 100° C. to 400° C. while the insulating layer 396 and the oxide semiconductor layer 399 are in contact with each other. Since the insulating layer 396 in this embodiment has a lot of defects, with this heat treatment, an impurity such as hydrogen, moisture, a hydroxyl group, or hydride contained in the oxide semiconductor layer 399 can be diffused to the insulating layer 396 so that the impurity in the oxide semiconductor layer 399 can be further reduced.

Figure 13E:
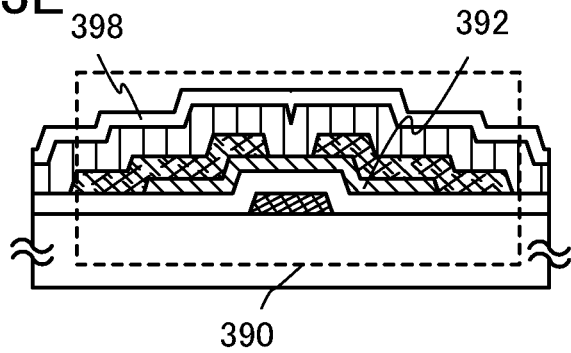

Through the above steps, the transistor 390 including an oxide semiconductor layer 392 in which the concentration of hydrogen, moisture, a hydride group, or hydroxide is reduced can be formed (see FIG. 13E).

When the oxide semiconductor film is formed in the above manner, residual moisture in a reaction atmosphere is removed; thus, the concentration of hydrogen and hydride in the oxide semiconductor film can be reduced. Accordingly, the oxide semiconductor film can be stable.

A protective insulating layer may be provided over the oxide insulating layer. In this embodiment, a protective insulating layer 398 is formed over the insulating layer 396. As the protective insulating layer 398, a silicon nitride film, a silicon nitride oxide film, an aluminum nitride film, an aluminum nitride oxide film, or the like is used.

As the protective insulating layer 398, a silicon nitride film is formed by heating the substrate 394 over which layers up to the insulating layer 396 are formed, to a temperature of 100° C. to 400° C., introducing a sputtering gas containing high-purity nitrogen from which hydrogen and moisture are removed, and using a target of a silicon semiconductor. In that case also, it is preferable that residual moisture in the chamber be removed in the formation of the protective insulating layer 398 in a manner similar to that of the insulating layer 396.

In the case of forming the protective insulating layer 398, the substrate 394 is heated to a temperature of 100° C. to 400° C. at the time of deposition of the protective insulating layer 398, whereby hydrogen or moisture included in the oxide semiconductor layer can be diffused into the oxide insulating layer. In such a case, heat treatment after the formation of the insulating layer 396 is not necessarily performed.

In the case where a silicon oxide layer as the insulating layer 396 and a silicon nitride layer as the protective insulating layer 398 are stacked, the silicon oxide layer and the silicon nitride layer can be formed using a common silicon target in the same chamber. First, a sputtering gas containing oxygen is introduced and the silicon oxide layer is formed using a silicon target placed inside the chamber, and then the sputtering gas is changed to a sputtering gas containing nitrogen and the silicon nitride layer is formed using the same silicon target. Since the silicon oxide layer and the silicon nitride layer can be formed in succession without exposure to the atmosphere, an impurity such as hydrogen or moisture can be prevented from being adsorbed on the surface of the silicon oxide layer. In that case, after the silicon oxide layer as the insulating layer 396 and the silicon nitride layer as the protective insulating layer 398 are stacked, heat treatment (at a temperature of 100° C. to 400° C.) for diffusing hydrogen or moisture included in the oxide semiconductor layer into the oxide insulating layer is preferably performed.

After the protective insulating layer is formed, heat treatment may be further performed at a temperature of greater than or equal to 100° C. and less than or equal to 200° C. for one hour to 30 hours in the atmosphere. This heat treatment may be performed at a fixed heat temperature; alternatively, the following change in the heat temperature may be conducted plural times repeatedly: the heat temperature is increased from room temperature to a temperature greater than or equal to 100° C. and less than or equal to 200° C. and then decreased to room temperature. Further, this heat treatment may be performed before formation of the oxide insulating film under a reduced pressure. Under the reduced pressure, the heat treatment time can be shortened. With this heat treatment, a normally-off transistor can be obtained. Therefore, reliability of the semiconductor device can be improved.

When the oxide semiconductor layer serving as a channel formation region is formed over the gate insulating layer, residual moisture in a reaction atmosphere is removed; thus, the concentration of hydrogen and hydride in the oxide semiconductor layer can be reduced.

The above steps can be used for manufacture of a back-plane (a substrate over which a transistor is formed) of a liquid crystal display device. The above steps can be applied to a manufacturing process in which a glass substrate having a thickness of 1 mm or less and having a side that is longer than 1 m is used.

Accordingly, the p-channel transistor according to this embodiment can be obtained under the following conditions: the work function ($\phi_m$) of the conductor used for the source electrode layer and the drain electrode layer is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV.

Therefore, a highly functional and highly reliable semiconductor device in which a p-channel transistor and an n-channel transistor which include an oxide semiconductor are included and both polarities of the n-channel transistor and the p-channel transistor are used can be provided.

This embodiment can be implemented in combination with any of the other embodiments, as appropriate.

In this embodiment, an example of a p-channel transistor including an oxide semiconductor layer and an example of a manufacturing method of the p-channel transistor will be described in detail with reference to FIGS. 14A to 14E. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. Detailed description of the same portions is also omitted.

FIGS. 14A to 14E illustrate an example of a cross-sectional structure of a transistor. A transistor 310 illustrated in FIGS. 14A to 14E is one of bottom-gate thin film transistors and is also referred to as an inverted staggered thin film transistor.

Although description is given using a single-gate transistor as the transistor 310, a multi-gate transistor including a plurality of channel formation regions can be formed as needed.

A manufacturing process of the transistor 310 over a substrate 305 will be described below with reference to FIGS. 14A to 14E.

First, a conductive film is formed over the substrate 305 having an insulating surface, and then, a gate electrode layer 311 is formed in a first photolithography step. Note that a resist mask may be formed by an inkjet method. Formation of the resist mask by an inkjet method needs no photomask; thus, manufacturing cost can be reduced.

There is no particular limitation on a substrate that can be used as the substrate 305 having an insulating surface as long as it has at least heat resistance high enough to withstand heat treatment performed later. For example, a glass substrate of barium borosilicate glass, aluminoborosilicate glass, or the like can be used.

In the case where a glass substrate is used and the temperature at which the heat treatment performed later is high, a glass substrate whose strain point is greater than or equal to 730° C. is preferably used. As a glass substrate, a glass material such as aluminosilicate glass, aluminoborosilicate glass, or barium borosilicate glass is used, for example. A glass substrate in which the amount of barium oxide (BaO) is larger than that of boron oxide ($B_2O_3$), which is practical heat-resistance glass, is preferably used.

Note that instead of the glass substrate, a substrate formed of an insulator such as a ceramic substrate, a quartz substrate, or a sapphire substrate may be used. Alternatively, crystallized glass or the like may be used.

An insulating film serving as a base film may be provided between the substrate 305 and the gate electrode layer 311. The base film has a function of preventing diffusion of an impurity element from the substrate 305, and can be formed to have a single-layer structure or a stacked structure using one or more of a silicon nitride film, a silicon oxide film, a silicon nitride oxide film, and a silicon oxynitride film.

The gate electrode layer 311 can be formed as a single layer or a stacked layer using a metal material such as molybdenum, titanium, chromium, tantalum, tungsten, aluminum, copper, neodymium, or scandium or an alloy material containing any of these materials as its main component.

For example, as a two-layer structure of the gate electrode layer 311, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, a two-layer structure of a tungsten nitride layer and a tungsten layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Then, a gate insulating layer 307 is formed over the gate electrode layer 311.

The gate insulating layer 307 can be formed to have a single-layer structure or a stacked structure of one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. Alternatively, a high-density plasma CVD method using a microwave (2.45 GHz) may be used.

In this embodiment, a 100 nm-thick silicon oxynitride layer is formed by a plasma CVD method as the gate insulating layer 307.

Then, an oxide semiconductor film 330 is formed to a thickness of greater than or equal to 2 nm and less than or equal to 200 nm over the gate insulating layer 307.

Note that before the oxide semiconductor film 330 is formed by a sputtering method, dust attached on a surface of the gate insulating layer 307 is preferably removed by reverse sputtering in which an argon gas is introduced and plasma is generated. Note that instead of an argon atmosphere, a nitrogen atmosphere, a helium atmosphere, an oxygen atmosphere, or the like may be used.

Figure 14A:
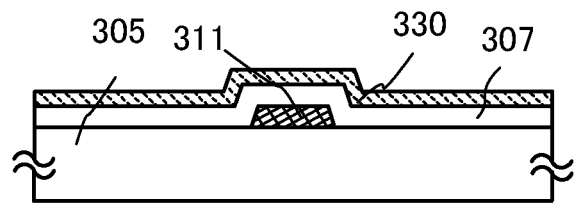
FIGS. 14A to 14E are views illustrating a manufacturing method of a semiconductor device.
Figure 14B:
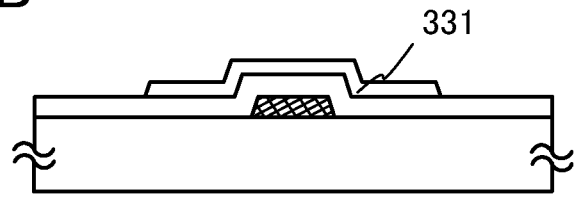

As the oxide semiconductor film 330, a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; or a two-component metal oxide film such as an In—Zn—O-based film, a Sn—Zn—O-based film, an Al—Zn—O-based film, a Zn—Mg—O-based film, a Sn—Mg—O-based film, or an In—Mg—O-based film; an In—O-based film, a Sn—O-based film, or a Zn—O-based film can be used. In addition, the above oxide semiconductor film may contain $SiO_2$. In this embodiment, the oxide semiconductor film 330 is formed by a sputtering method with the use of an In—Ga—Zn—O-based oxide semiconductor target. A cross-sectional view in this step is shown in FIG. 14A. The oxide semiconductor film 330 can be formed by a sputtering method in a rare gas (typically, argon) atmosphere, an oxygen atmosphere, or a mixed atmosphere including a rare gas (typically, argon) and oxygen.

As a target for forming the oxide semiconductor film 330 by a sputtering method, a metal oxide target containing zinc oxide as its main component can be used. As another example of a metal oxide target, an oxide target containing In, Ga, and Zn (in a composition ratio, $In_2O_3$:$Ga_2O_3$:ZnO=1:1:1 [molar ratio], or In:Ga:Zn=1:1:0.5 [atomic ratio]) can be used. In addition, as the oxide target containing In, Ga, and Zn, a target having a composition ratio of In:Ga:Zn=1:1:1 [atomic ratio] or In:Ga:Zn=1:1:2 [atomic ratio] can be used. The fill rate of the oxide target is greater than or equal to 90% and less than or equal to 100%, preferably, greater than or equal to 95% and less than or equal to 99.9%. With the use of the oxide target with high fill rate, a dense oxide semiconductor film is formed.

It is preferable to use a high-purity gas from which an impurity such as hydrogen, water, a hydroxyl group, or hydride is removed so that the concentration is approximately several parts per million or approximately several parts per billion, as a sputtering gas used when the oxide semiconductor film 330 is formed.

The substrate is held in the chamber which is kept in a reduced-pressure state, and the substrate temperature is set to greater than or equal to 100° C. or less than or equal to 600° C., preferably greater than or equal to 200° C. and less than or equal to 400° C. By heating the substrate during deposition, the impurity concentration of the oxide semiconductor film can be reduced. In addition, damage by sputtering can be reduced. Then, a sputtering gas from which hydrogen and moisture are removed is introduced into the chamber from which residual moisture is being removed, and an oxide semiconductor film 330 is deposited over the substrate 305 with use of a metal oxide as a target. In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like (preferably, a compound including a carbon atom as well), for example, is exhausted. Accordingly, the concentration of impurities included in the oxide semiconductor film formed in the chamber can be reduced.

As an example of the deposition condition, the distance between the substrate and the target is 100 mm, the pressure is 0.6 Pa, the direct-current (DC) power source is 0.5 kW, and the atmosphere is an oxygen atmosphere (the proportion of oxygen flow is 100%). The thickness of the oxide semiconductor film is preferably greater than or equal to 5 nm and less than or equal to 30 nm Note that an appropriate thickness differs depending on an oxide semiconductor material, and the thickness may be set as appropriate depending on the material.

Then, the oxide semiconductor film 330 is processed into an island-shaped oxide semiconductor layer by a second photolithography step. A resist mask used for forming the island-shaped oxide semiconductor layer may be formed by an inkjet method. Formation of the resist mask by an inkjet method needs no photomask; thus, manufacturing cost can be reduced.

Next, the oxide semiconductor layer is subjected to first heat treatment. With the first heat treatment, dehydration or dehydrogenation of the oxide semiconductor layer can be conducted. A temperature of the first heat treatment is greater than or equal to 400° C. and less than or equal to 750° C., preferably greater than or equal to 400° C. and less than the strain point of the substrate. Here, the substrate is put in an electric furnace that is a kind of heat treatment apparatus and the oxide semiconductor layer is subjected to heat treatment in a nitrogen atmosphere at 450° C. for one hour, and then, water or hydrogen is prevented from being mixed into the oxide semiconductor layer without exposure to the atmosphere; thus, an oxide semiconductor layer 331 is obtained (see FIG. 14B).

Note that the heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed. With GRTA, high-temperature heat treatment for a short period of time can be achieved.

In the first heat treatment, it is preferable that water, hydrogen, or the like be not contained in nitrogen or a rare gas such as helium, neon, or argon. It is preferable that nitrogen or a rare gas such as helium, neon, or argon which is introduced into the heat treatment apparatus have a purity of 6N (99.9999%) or more, more preferably 7N (99.99999%) or more (that is, the impurity concentration be 1 ppm or less, more preferably 0.1 ppm or less).

The first heat treatment of the oxide semiconductor layer can also be performed on the oxide semiconductor film 330 before being processed into the island-shaped oxide semiconductor layer. In that case, the substrate is taken out from the heat treatment apparatus after the first heat treatment, and then a photolithography step is performed thereon.

The heat treatment which is effective for dehydration or dehydrogenation may be performed after a source electrode and a drain electrode are stacked on the oxide semiconductor layer or after a protective insulating film is formed over the source electrode and the drain electrode as long as it is performed after the deposition of the oxide semiconductor layer.

In the case where a contact hole is formed in the gate insulating layer 307, a step thereof can be performed before or after the dehydration or dehydrogenation is performed on the oxide semiconductor film 330.

The etching of the oxide semiconductor film is not limited to wet etching and may be dry etching.

In order to etch the film into a desired shape, etching conditions (e.g., etchant, etching time, temperature, or the like) are controlled as appropriate depending on the material.

The work function ($\phi_m$) of the conductor used for the source electrode layer and the drain electrode layer (including a wiring which is formed of the same layer as the source and the drain electrode layer) satisfies $\phi_m > \chi + E_g/2$ and the barrier for holes ($\phi_{Bp}$) represented by ($\chi + E_g - \phi_m$) is less than 0.25 eV, so that holes are injected from the conductor of the source electrode layer, pass through the oxide semiconductor, and reach the conductor of the drain electrode layer. Thus, the transistor can operate as a p-channel transistor.

A conductive film is formed over the gate insulating layer 307 and the oxide semiconductor layer 331. The conductive film may be formed by a sputtering method or a vacuum evaporation method. As a material for a conductive film serving as the source electrode layer and the drain electrode layer, metal oxide such as tin oxide (SnO), LaCuOCh (Ch=chalcogen such as S or Se), $CuAO_2$ (A=B, Al, Ga, In, or the like), $SrCu_2O_2$, NiO, $Cu_2O$, or CuO can be used, for example. An impurity may be added in order to increase the conductivity of the metal oxide. For example, LaCuOCh to which Mg is added or NiO to which Li is added can be used.

In the case where heat treatment is performed after the deposition of the conductive film, it is preferable that the conductive film have heat resistance high enough to withstand the heat treatment.

Figure 14C:
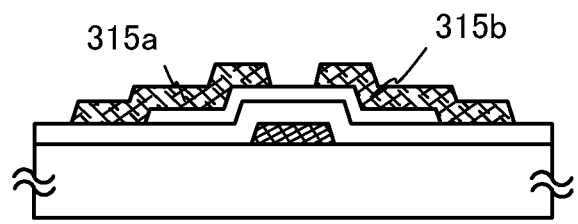

A resist mask is formed over the conductive film by a third photolithography step, and a source electrode layer 315a and a drain electrode layer 315b are formed by selective etching, and then, the resist mask is removed (see FIG. 14C).

Ultraviolet light, a KrF laser beam, or an ArF laser beam is used for light exposure for forming the resist mask in the third photolithography step. The channel length L of a transistor to be formed is determined by a pitch between a lower end of the source electrode layer and a lower end of the drain electrode layer, which are adjacent to each other over the oxide semiconductor layer 331. Note that when light exposure is performed in the case where the channel length L is shorter than 25 nm, extreme ultraviolet with extremely short wavelengths of several nanometers to several tens of nanometers is used for light exposure for forming the resist mask in the third photolithography step. In light exposure using extreme ultraviolet, resolution is high and depth of focus is large. Thus, the channel length L of the transistor to be formed later can be more than or equal to 10 nm and less than or equal to 1000 nm and the operation speed of a circuit can be increased, and furthermore the value of off-state current is extremely small, and thus lower power consumption can be achieved.

Materials of the layers and etching conditions are adjusted as appropriate so that the oxide semiconductor layer 331 is not removed in etching of the conductive film.

In this embodiment, a Ti film is used as the conductive film and the In—Ga—Zn—O-based oxide semiconductor is used for the oxide semiconductor layer 331, and an ammonium hydrogen peroxide solution (31 wt % hydrogen peroxide in water: 28 wt % ammonia water: water=5:2:2) is used as an etchant.

Note that, in the third photolithography step, only part of the oxide semiconductor layer 331 is etched, whereby an oxide semiconductor layer having a groove (a depressed portion) is formed in some cases. Further, the resist mask for forming the source electrode layer 315a and the drain electrode layer 315b may be formed by an inkjet method. Formation of the resist mask by an inkjet method needs no photomask; thus, manufacturing cost can be reduced.

Further, an oxide conductive layer may be formed between the oxide semiconductor layer and the source and drain electrode layers. The oxide conductive layer and the metal layer for forming the source and drain electrode layers can be formed successively. The oxide conductive layer can function as a source region and a drain region.

By providing the oxide conductive layer as the source region and the drain region between the oxide semiconductor layer and the source and drain electrode layers, the resistance of the source region and the drain region can be decreased and the transistor can be operated at high speed.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed with one multi-tone mask. Thus, the number of light-exposure masks can be reduced and the number of corresponding photolithography steps can be also reduced, whereby simplification of a process can be realized.

Next, plasma treatment may be performed using a gas such as $N_2O$, $N_2$, or Ar so that water adsorbed to a surface of an exposed portion of the oxide semiconductor layer is removed.

The plasma treatment is performed and after that, the insulating layer 316 which serves as a protective insulating film in contact with part of the oxide semiconductor layer is formed without exposure to the atmosphere.

The insulating layer 316 can be formed to a thickness of at least 1 nm by a method by which an impurity such as water or hydrogen does not enter the insulating layer 316, such as a sputtering method as appropriate. When hydrogen is contained in the insulating layer 316, entry of the hydrogen to the oxide semiconductor layer or extraction of oxygen in the oxide semiconductor layer by hydrogen may occur, thereby causing the backchannel of the oxide semiconductor layer to have lower resistance (to be n-type), so that a parasitic channel may be formed. Therefore, it is important that a formation method in which hydrogen is not used is employed so that the insulating layer 316 is formed containing as little hydrogen as possible.

In this embodiment, a 200-nm-thick silicon oxide film is deposited as the insulating layer 316 by a sputtering method. The substrate temperature at the time of film deposition may be greater than or equal to room temperature and less than or equal to 300° C., and in this embodiment, is 100° C. The silicon oxide film can be formed by a sputtering method in a rare gas (typically, argon) atmosphere, an oxygen atmosphere, or a mixed atmosphere containing a rare gas (typically, argon) and oxygen. As a target, a silicon oxide target or a silicon target can be used. For example, with the use of a silicon target, silicon oxide can be deposited by a sputtering method in an atmosphere of oxygen and nitrogen. The insulating layer 316 that is in contact with the oxide semiconductor layer whose resistance is reduced is formed using an inorganic insulating film which does not include impurities such as moisture, a hydrogen ion, or OH⁻ and blocks the entry of these impurities from the outside. Typically, a silicon oxide film, a silicon oxynitride film, an aluminum oxide film, an aluminum oxynitride film, or the like is used.

In that case, it is preferable to remove residual moisture in the chamber in the deposition of the insulating layer 316. This is in order to prevent the oxide semiconductor layer 331 and the insulating layer 316 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the insulating layer 316 formed in the chamber can be reduced.

It is preferable to use a high-purity gas from which an impurity such as hydrogen, water, a hydroxyl group, or hydride is removed so that the concentration is approximately several parts per million or approximately several parts per billion, as a sputtering gas used when the insulating layer 316 is formed.

Then, the second heat treatment is performed in an inert gas atmosphere or an oxygen gas atmosphere (preferably at 200 to 400° C., e.g., at 250 to 350° C.). For example, the second heat treatment is performed in a nitrogen atmosphere at 250° C. for one hour. In the second heat treatment, heat is applied while part of the oxide semiconductor layer (the channel formation region) is in contact with the insulating layer 316.

Through the above steps, the following is conducted: the formed oxide semiconductor layer is subjected to heat treatment for dehydration or dehydrogenation so that impurities such as hydrogen, moisture, a hydroxyl group, or hydride (also referred to as a hydrogen compound) which cause the variation are removed from the oxide semiconductor layer; and the oxide semiconductor layer is highly purified to become electrically i-type (intrinsic) by supplying oxygen which is a major component of an oxide semiconductor, which is simultaneously reduced in a step of removing impurities.

In the case where heat treatment for dehydration or dehydrogenation is performed in an inert gas atmosphere such as a nitrogen atmosphere or a rare gas atmosphere, the oxide semiconductor layer that has been subjected to the heat treatment has a lower resistance. Therefore, when the oxide semiconductor layer is provided in contact with the insulating layer 316 so as to supply oxygen in this embodiment, part of the oxide semiconductor layer which is in contact with the insulating layer 316 is selectively made to be in an oxygen-excess state and thus can be used as an i-type channel formation region. In that case, regions of an oxide semiconductor layer 312 which overlap with the source electrode layer 315a or the drain electrode layer 315b and are not in direct contact with the insulating layer 316 become an n-type owing to oxygen deficiency in a self-aligned manner. Such regions can function as a high-resistance source region or a high-resistance drain region. With such a structure, the high-resistance drain region serves as a buffer and a high electric field is not applied locally even when a high electric field is applied between the gate electrode layer 311 and the drain electrode layer 315*b*; thus, the withstand voltage of the transistor can be improved.

Figure 14D:
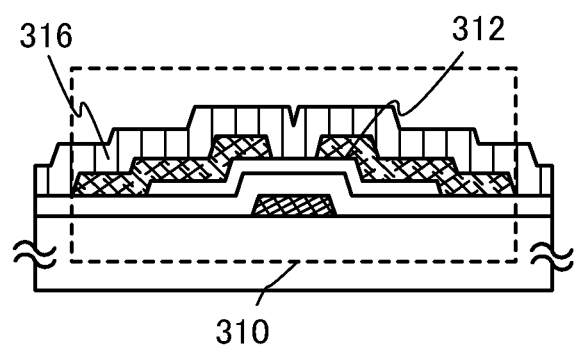
Figure 14E:
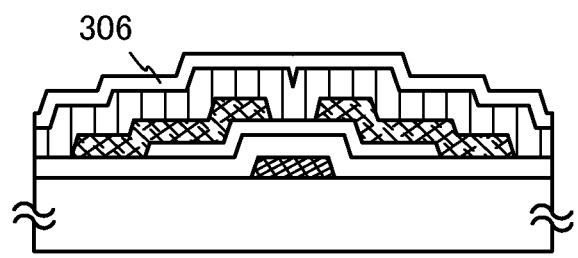

Through the above steps, the transistor 310 is formed (see FIG. 14D).

When a silicon oxide layer having a lot of defects is used as the oxide insulating layer, by this heat treatment after the silicon oxide layer is formed, an impurity such as hydrogen, moisture, a hydroxyl group, or hydride contained in the oxide semiconductor layer can be diffused to the oxide insulating layer so that the impurity in the oxide semiconductor layer can be further reduced.

A protective insulating layer may be additionally formed over the insulating layer 316. For example, a silicon nitride film is formed by an RF sputtering method. An RF sputtering method is preferable as a method for forming the protective insulating layer because it has high productivity. The protective insulating layer is formed using an inorganic insulating film which does not contain impurities such as moisture, a hydrogen ion, and OH⁻ and blocks entry of these impurities from the outside; for example, a silicon nitride film, an aluminum nitride film, a silicon nitride oxide film, an aluminum nitride oxide film, or the like is used. In this embodiment, as the protective insulating layer, a protective insulating layer 306 is formed using a silicon nitride film (see FIG. 14E).

In this embodiment, as the protective insulating layer 306, a silicon nitride film is formed by heating the substrate 305 over which layers up to the insulating layer 316 are formed, to a temperature of 100° C. to 400° C., introducing a sputtering gas containing high-purity nitrogen from which hydrogen and moisture are removed, and using a target of a silicon semiconductor. In that case also, it is preferable that residual moisture in the chamber be removed in the formation of the protective insulating layer 306 in a manner similar to that of the insulating layer 316.

After the protective insulating layer is formed, heat treatment may be further performed at a temperature of greater than or equal to 100° C. and less than or equal to 200° C. for one hour to 30 hours in the atmosphere. This heat treatment may be performed at a fixed heat temperature; alternatively, the following change in the heat temperature may be conducted plural times repeatedly: the heat temperature is increased from room temperature to a temperature greater than or equal to 100° C. and less than or equal to 200° C. and then decreased to room temperature. Further, this heat treatment may be performed before formation of the oxide insulating film under a reduced pressure. Under the reduced pressure, the heat treatment time can be shortened.

A planarization insulating layer for planarization may be provided over the protective insulating layer 306.

Accordingly, the p-channel transistor according to this embodiment can be obtained under the following conditions: the work function ($\phi_m$) of the conductor used for the source electrode layer and the drain electrode layer is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV.

Therefore, a highly functional and highly reliable semiconductor device in which a p-channel transistor and an n-channel transistor which include an oxide semiconductor are included and both polarities of the n-channel transistor and the p-channel transistor are used can be provided.

This embodiment can be implemented in combination with any of the other embodiments, as appropriate.

(Embodiment 7)

Figure 15:
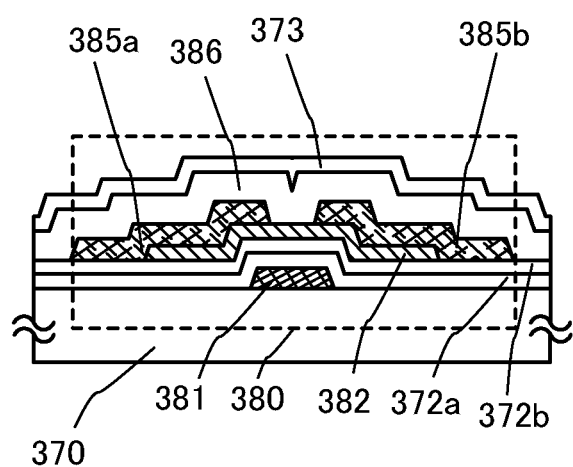
FIG. 15 is a view illustrating a semiconductor device.

In this embodiment, an example of a transistor including an oxide semiconductor layer and an example of a manufacturing method of the transistor will be described in detail with reference to FIG. 15.

In this embodiment, an example of a manufacturing process of a transistor, which is partly different from that of Embodiment 6, will be described with reference to FIG. 15. Since a manufacturing process of a transistor in FIG. 15 is the same as that of the t transistor in FIGS. 14A to 14E except for some steps, the same reference numerals are used for the same portions, and detailed description of the same portions is not repeated.

In accordance with Embodiment 6, a gate electrode layer 381 is formed over a substrate 370, and a first gate insulating layer 372*a* and a second gate insulating layer 372*b* are stacked. In this embodiment, a gate insulating layer has a two-layer structure in which a nitride insulating layer and an oxide insulating layer are used as the first gate insulating layer 372*a* and the second gate insulating layer 372*b*, respectively.

As the oxide insulating layer, a silicon oxide layer, a silicon oxynitride layer, an aluminum oxide layer, an aluminum oxynitride layer, a hafnium oxide layer, or the like can be used. As the nitride insulating layer, a silicon nitride layer, a silicon nitride oxide layer, an aluminum nitride layer, an aluminum nitride oxide layer, or the like can be used.

In the structure of this embodiment, a silicon nitride layer and a silicon oxide layer are sequentially stacked from the gate electrode layer 381 side. A 150-nm-thick gate insulating layer is formed in such a manner that a silicon nitride layer ($SiN_y$ (y>0)) having a thickness of greater than or equal to 50 nm and less than or equal to 200 nm (in this embodiment, 50 nm) is formed by a sputtering method as the first gate insulating layer 372*a* and then a silicon oxide layer ($SiO_x$ (x>0)) having a thickness of greater than or equal to 5 nm and less than or equal to 300 nm (in this embodiment, 100 nm) is stacked as the second gate insulating layer 372*b* over the first gate insulating layer 372*a*.

Next, an oxide semiconductor film is formed and is processed into an island-shaped oxide semiconductor layer by a photolithography step. In this embodiment, the oxide semiconductor film is formed by a sputtering method using an In—Ga—Zn—O-based oxide semiconductor target.

In that case, it is preferable to remove residual moisture in the chamber in the deposition of the oxide insulating film. This is in order to prevent the oxide semiconductor film from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide semiconductor film formed in the chamber can be reduced.

It is preferable to use a high-purity gas from which an impurity such as hydrogen, water, a hydroxyl group, or hydride is removed so that the concentration is approximately several parts per million or approximately several parts per billion, as a sputtering gas used when the oxide semiconductor film is formed.

Next, the oxide semiconductor layer is dehydrated or dehydrogenated. The temperature of the first heat treatment for the dehydration or dehydrogenation is greater than or equal to 400° C. and less than or equal to 750° C., preferably greater than or equal to 425° C. and less than or equal to 750° C. Note that in the case where the temperature of the first heat treatment is 425° C. or more, the heat treatment time may be one hour or less, while in the case where the temperature of the first heat treatment is less than 425° C., the heat treatment time is set to more than one hour. In this embodiment, the substrate is put in an electric furnace which is a kind of heat treatment apparatus and heat treatment is performed on the oxide semiconductor layer in a nitrogen atmosphere, and then, water or hydrogen is prevented from entering the oxide semiconductor layer, without exposure to the atmosphere; thus, an oxide semiconductor layer is obtained. After that, cooling is performed by introduction of a high-purity oxygen gas, a high-purity N$_2$O gas, or ultra-dry air (having a dew point of −40° C. or lower, preferably −60° C. or lower) into the same furnace. It is preferable that the oxygen gas or the N$_2$O gas do not contain water, hydrogen, or the like. Alternatively, the purity of an oxygen gas or an N$_2$O gas which is introduced into the heat treatment apparatus is preferably 6N (99.9999%) or more, further preferably 7N (99.99999%) or more (that is, the impurity concentration in the oxygen gas or the N$_2$O gas is 1 ppm or less, preferably 0.1 ppm or less).

The oxide semiconductor layer is subjected to heat treatment for dehydration or dehydrogenation so that impurities such as hydrogen, moisture, a hydroxyl group, or hydride (also referred to as a hydrogen compound) which cause the variation are removed from the oxide semiconductor layer; and the oxide semiconductor layer is highly purified to become electrically i-type (intrinsic) by supplying oxygen which is a major component of an oxide semiconductor, which is simultaneously reduced in a step of removing impurities.

Note that the heat treatment apparatus is not limited to an electric furnace. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. An LRTA apparatus may be provided with not only a lamp but also a device that heats an object to be processed by thermal conduction or thermal radiation from a heater such as a resistance heater or the like. GRTA is a method for heat treatment using a high-temperature gas. As the gas, an inert gas which does not react by heat treatment with the object to be processed, like nitrogen or a rare gas such as argon, is used. The heat treatment may be performed at 600° C. to 750° C. for several minutes by an RTA method.

After the first heat treatment for dehydration or dehydrogenation, heat treatment may be performed at a temperature of greater than or equal to 200° C. and less than or equal to 400° C., preferably greater than or equal to 200° C. and less than or equal to 300° C., in an oxygen gas atmosphere or a N$_2$O gas atmosphere.

The first heat treatment of the oxide semiconductor layer can also be performed on the oxide semiconductor film before being processed into the island-shaped oxide semiconductor layer. In that case, the substrate is taken out from the heat treatment apparatus after the first heat treatment, and then a photolithography step is performed thereon.

The entire oxide semiconductor film is made to be in an oxygen-excess state through the above steps, whereby the oxide semiconductor film has higher resistance, that is, becomes i-type. Accordingly, an oxide semiconductor layer 382 whose entire region is i-type is formed.

Next, a resist mask is formed over the oxide semiconductor layer 382 by a photolithography step, and selective etching is performed to form a source electrode layer 385a and a drain electrode layer 385b.

The work function ($\phi_m$) of the conductor used for the source electrode layer 385a and the drain electrode layer 385b (including a wiring which is formed of the same layer as the source electrode layer 385a and the drain electrode layer 385b) satisfies $\phi_m > \chi + E_g/2$ and the bather for holes ($\phi_{Bp}$) represented by $(\chi + E_g - \phi_m)$ is less than 0.25 eV, so that holes are injected from the conductor of the source electrode layer 385a, pass through the oxide semiconductor, and reach the conductor of the drain electrode layer 385b. Thus, the transistor can operate as a p-channel transistor.

The source electrode layer 385a and the drain electrode layer 385b may be formed by a sputtering method or a vacuum evaporation method. As a material for the source electrode layer 385a and the drain electrode layer 385b, metal oxide such as tin oxide (SnO), LaCuOCh (Ch=chalcogen such as S or Se), CuAO$_2$ (A=B, Al, Ga, In, or the like), SrCu$_2$O$_2$, NiO, Cu$_2$O, or CuO can be used, for example. An impurity may be added in order to increase the conductivity of the metal oxide. For example, LaCuOCh to which Mg is added or NiO to which Li is added can be used.

Next, an oxide insulating layer 386 is formed over the oxide semiconductor layer 382, the source electrode layer 385a, and the drain electrode layer 385b by a sputtering method.

In that case, it is preferable to remove residual moisture in the chamber in the deposition of the oxide insulating layer 386. This is in order to prevent the oxide semiconductor layer 382 and the oxide insulating layer 386 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water (H$_2$O), or the like, for example, is exhausted. Accordingly, the concentration of impurities included in the oxide insulating layer 386 formed in the chamber can be reduced.

It is preferable to use a high-purity gas from which an impurity such as hydrogen, water, a hydroxyl group, or hydride is removed so that the concentration is approximately several parts per million or approximately several parts per billion, as a sputtering gas used when the oxide insulating layer 386 is formed.

Through the above steps, a transistor 380 is formed.

Next, heat treatment (preferably at a temperature of greater than or equal to 150° C. and less than 350° C.) may be performed in an inert gas atmosphere or a nitrogen gas atmosphere in order to suppress variation of electric characteristics of the transistor. For example, heat treatment is performed in a nitrogen atmosphere at 250° C. for 1 hour.

A protective insulating layer 373 is formed over the oxide insulating layer 386. In this embodiment, a 100-nm-thick silicon nitride film is formed as the protective insulating layer 373 by a sputtering method.

The protective insulating layer 373 and the first gate insulating layer 372a, which are formed using nitride insulating layers, do not contain impurities such as moisture, hydrogen, hydride, or hydroxide and has the advantageous effect of blocking the entry of these impurities from the outside.

Therefore, in the manufacturing process after the formation of the protective insulating layer 373, the entry of impurities such as moisture from the outside can be prevented. Further, even after a semiconductor device including a display panel, for example, a device is completed as a liquid crystal display device, the entry of impurities such as moisture from the outside can be prevented in the long term; therefore, long-term reliability of the device can be improved.

The insulating layers provided between the protective insulating layer 373 and the first gate insulating layer 372a which are nitride insulating layers may be removed to make the protective insulating layer 373 be in contact with the first gate insulating layer 372a.

Accordingly, impurities such as moisture, hydrogen, hydride, or hydroxide in the oxide semiconductor layer can be reduced to the minimum and the re-entry thereof can be prevented, so that the concentration of impurities in the oxide semiconductor layer can be kept low.

A planarization insulating layer for planarization may be provided over the protective insulating layer 373.

Accordingly, the p-channel transistor according to this embodiment can be obtained under the following conditions: the work function ($\phi_m$) of the conductor used for the source electrode layer and the drain electrode layer is larger than the sum of the electron affinity ($\chi$) of an oxide semiconductor and half of the energy gap ($E_g/2$) of the oxide semiconductor (i.e., $\phi_m > \chi + E_g/2$), and the barrier for holes ($\phi_{Bp}$) represented by ($\chi + E_g - \phi_m$) is less than 0.25 eV.

Therefore, a highly functional and highly reliable semiconductor device in which a p-channel transistor and an n-channel transistor which include an oxide semiconductor are included and both polarities of the n-channel transistor and the p-channel transistor are used can be provided.

This embodiment can be implemented in combination with any of the other embodiments, as appropriate.

(Embodiment 8)

By manufacturing transistors and using the transistors for a pixel portion and driver circuit, a semiconductor device having a display function (also referred to as a display device) can be manufactured. Moreover, some or all of the driver circuits which include the thin film transistors, can be formed over a substrate where the pixel portion is formed, whereby a system-on-panel can be obtained.

The display device includes a display element. Examples of the display element include a liquid crystal element (also referred to as a liquid crystal display element) and a light-emitting element (also referred to as a light-emitting display element). The light-emitting element includes an element whose luminance is controlled by current or voltage in its category, and specifically includes an inorganic electroluminescent (EL) element, an organic EL element, and the like in its category. Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any other state.

Note that a display device in this specification refers to an image display device or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

Figure 16A:
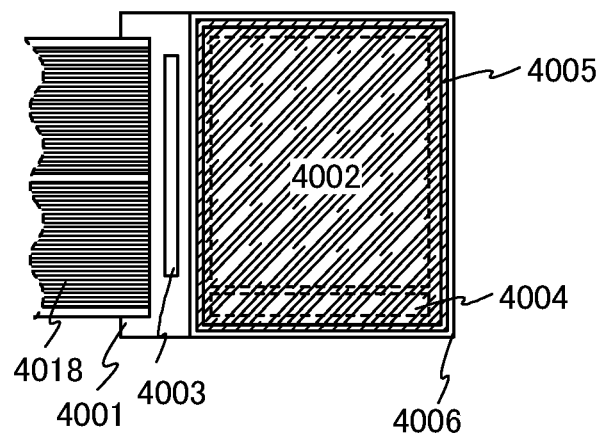
FIGS. 16A and 16B are each a view illustrating a semiconductor device.
Figure 16B:
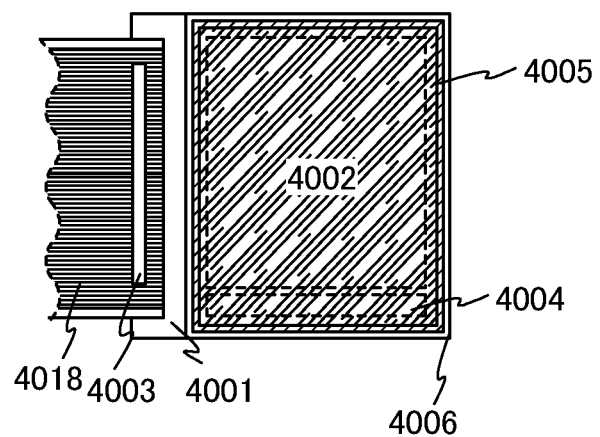

The appearance and a cross section of a display panel, which is one embodiment of a semiconductor device, will be described with reference to FIGS. 16A and 16B. FIGS. 16A and 16B are plan views of display panels in which a transistor and a display element are sealed between a first substrate 4001 and a second substrate 4006 with a sealing material 4005.

The sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealing material 4005, and the second substrate 4006. A signal line driver circuit 4003 that is formed using a single crystal semiconductor film or a polycrystalline semiconductor film over a substrate separately prepared is mounted in a region that is different from the region surrounded by the sealing material 4005 over the first substrate 4001.

Note that there is no particular limitation on the connection method of the driver circuit which is separately formed, and a COG method, a wire bonding method, a TAB method, or the like can be used. FIG. 16A illustrates an example in which the signal line driver circuit 4003 is mounted by a COG method. FIG. 16B illustrates an example in which the signal line driver circuit 4003 is mounted by a TAB method.

The pixel portion 4002 and the scan line driver circuit 4004 which are formed over the first substrate 4001 have a plurality of transistors. The p-channel transistor described in any of Embodiments 1 to 7 can be applied to the transistors. In addition, the CMOS structure described in Embodiment 2 can be applied to the transistors.

The oxide semiconductor layer used in this specification functions as a path through which a carrier passes without being defined as an n-type oxide semiconductor layer or a p-type oxide semiconductor layer. The n-channel transistor and the p-channel transistor can be manufactured using the same material of an i-type (intrinsic) oxide semiconductor layer. The work function ($\phi_m$) of the conductor used for the source electrode layer and the drain electrode layer in contact with the oxide semiconductor layer is controlled, so that the n-channel transistor and the p-channel transistor can be separately formed. Accordingly, the n-channel transistor and the p-channel transistor can be manufactured as follows: the source electrode layer and the drain electrode layer of the n-channel transistor are formed using a different material in a different step from those of the p-channel transistor, and the gate electrode layer, the gate insulating layer, the oxide semiconductor layer, and the like of the n-channel transistor can be formed using the same material as those of the p-channel transistor. The CMOS structure can be manufactured without complicating the manufacturing process, leading to advantages in productivity and cost.

In the case where a liquid crystal element is used as the display element, TN liquid crystal, OCB liquid crystal, STN liquid crystal, VA liquid crystal, ECB liquid crystal, GH liquid crystal, polymer dispersed liquid crystal, discotic liquid crystal, or the like can be used. Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is generated within an only narrow range of temperature, a liquid crystal composition containing a chiral agent at 5 wt % or more is used for a liquid crystal layer in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A thin film transistor including an oxide semiconductor layer particularly has the possibility that electric characteristics of the thin film transistor may fluctuate significantly by the influence of static electricity and deviate from the designed range. Therefore, it is more effective to use a blue phase liquid crystal material for a liquid crystal display device that includes a transistor including an oxide semiconductor layer.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like is used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an ASV mode, or the like can be used.

Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a direction perpendicular to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

An active matrix substrate formed with the use of the transistor described in any of Embodiments 1 to 7 may be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these. As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The active matrix substrate formed with the use of the transistor described in any of Embodiments 1 to 7 can be used for a light-emitting display device (light-emitting device) including a light-emitting element utilizing electroluminescence. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Accordingly, a highly functional and highly reliable semiconductor device in which a p-channel transistor and an n-channel transistor which include an oxide semiconductor are included and both polarities of the n-channel transistor and the p-channel transistor are used can be provided.

This embodiment can be implemented in combination with any of the other embodiments, as appropriate.

(Embodiment 9)

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 17A:
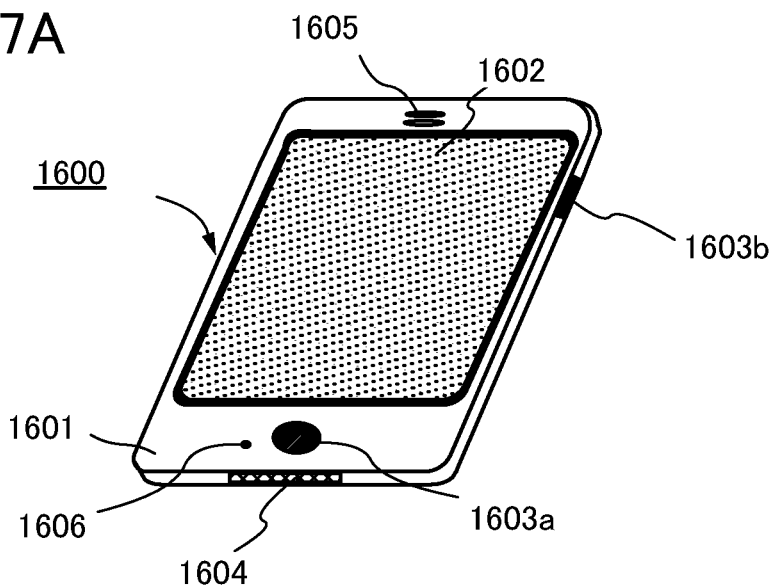
FIGS. 17A and 17B are each a view illustrating an electronic appliance.

FIG. 17A illustrates an example of a mobile phone. A mobile phone 1600 is provided with a display portion 1602 incorporated in a housing 1601, operation buttons 1603a and 1603b, an external connection port 1604, a speaker 1605, a microphone 1606, and the like.

When the display portion 1602 is touched with a finger or the like, data can be input to the mobile phone 1600 illustrated in FIG. 17A. In addition, operations such as making a call and composing a mail can be performed when the display portion 1602 is touched with a finger or the like.

There are mainly three screen modes of the display portion 1602. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1602 so that text displayed on a screen can be input. In this case, it is preferable to display a keyboard or number buttons on almost all area of the screen of the display portion 1602.

When a detection device including a sensor for detecting inclination, such as a gyroscope or an acceleration sensor, is provided inside the mobile phone 1600, display on the screen of the display portion 1602 can be automatically switched by determining the direction of the mobile phone 1600 (whether the mobile phone 1600 is placed horizontally or vertically for a landscape mode or a portrait mode).

The screen modes are switched by touching the display portion 1602, or operating the operation buttons 1603a and 1603b of the housing 1601. Alternatively, the screen modes may be switched depending on the kind of image displayed on the display portion 1602. For example, when a signal of an image displayed on the display portion is a signal of moving image data, the screen mode is changed to the display mode. When the signal is a signal of text data, the screen mode is changed to the input mode.

Further, in the input mode, when input by touching the display portion 1602 is not performed for a certain period while a signal detected by an optical sensor in the display portion 1602 is detected, the screen mode may be controlled so as to be changed from the input mode to the display mode.

The display portion 1602 may function as an image sensor. For example, an image of a palm print, a fingerprint, or the like is taken when the display portion 1602 is touched with a palm or a finger, whereby personal identification can be performed. Further, by providing a backlight or a sensing light source which emits near-infrared light in the display portion, an image of a finger vein, a palm vein, or the like can be taken.

Any of the semiconductor devices described in the above embodiments can be applied to the display portion 1602. For example, a plurality of thin film transistors described in the above embodiments can be disposed as switching elements of pixels.

Figure 17B:
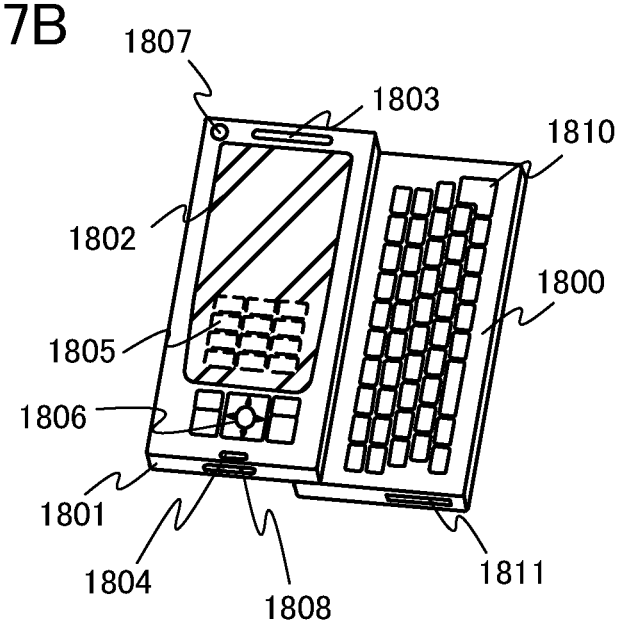

FIG. 17B also illustrates an example of a mobile phone. A portable information terminal whose example is illustrated in FIG. 17B can have a plurality of functions. For example, in addition to a telephone function, such a portable information terminal can have a function of processing a variety of pieces of data by incorporating a computer.

The portable information terminal illustrated in FIG. 17B is formed of a housing 1800 and a housing 1801. The housing 1800 includes a display panel 1802, a speaker 1803, a microphone 1804, a pointing device 1806, a camera lens 1807, an external connection terminal 1808, and the like. The housing 1801 includes a keyboard 1810, an external memory slot 1811, and the like. In addition, an antenna is incorporated in the housing 1801.

Further, the display panel 1802 is provided with a touch panel. A plurality of operation keys 1805 which are displayed as images are illustrated by dashed lines in FIG. 17B.

Further, in addition to the above structure, a contactless IC chip, a small memory device, or the like may be incorporated.

The semiconductor device described in the above embodiments can be used for the display panel 1802 and the direction of display is changed appropriately depending on an application mode. Further, the semiconductor device is provided with the camera lens 1807 on the same surface as the display panel 1802, and thus it can be used as a videophone. The speaker 1803 and the microphone 1804 can be used for videophone calls, recording, and playing sound, etc. as well as voice calls. Moreover, the housings 1800 and 1801 in a state where they are developed as illustrated in FIG. 17B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 18A:
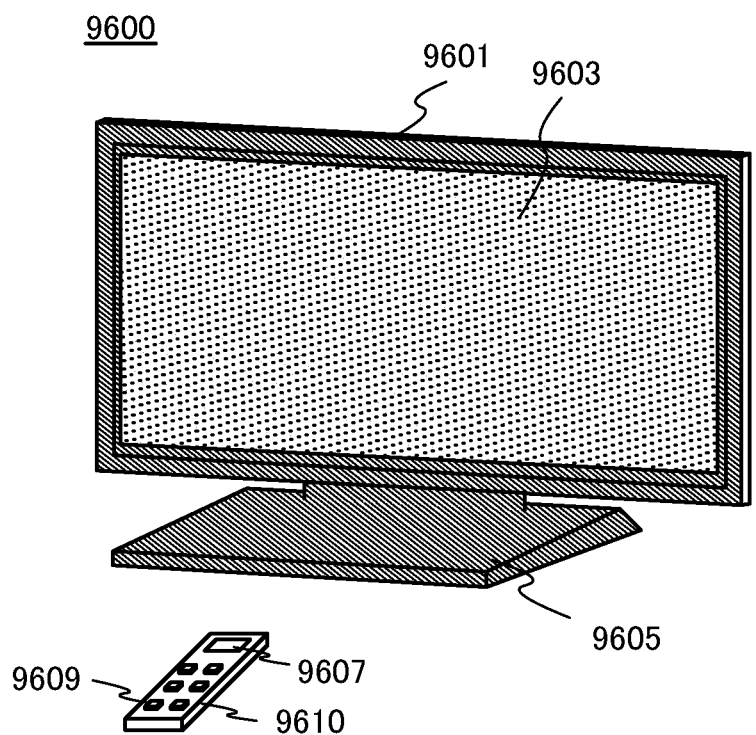
FIGS. 18A and 18B are each a view illustrating an electronic appliance.

FIG. 18A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Any of the semiconductor devices described in the above embodiments can be applied to the display portion 9603. For example, a plurality of thin film transistors described in the above embodiments can be disposed as switching elements of pixels.

Figure 18B:
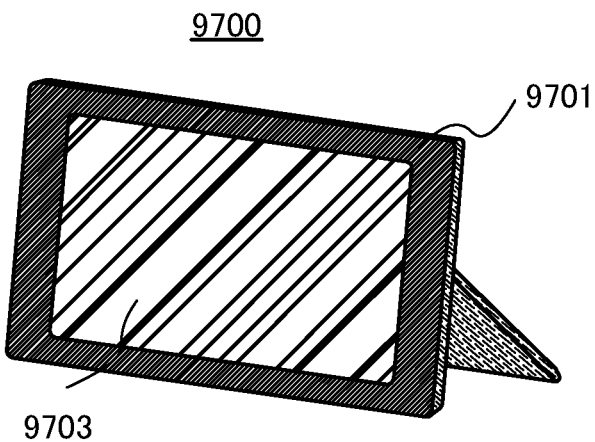

FIG. 18B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Any of the semiconductor devices described in the above embodiments can be applied to the display portion 9703. For example, a plurality of thin film transistors described in the above embodiments can be disposed as switching elements of pixels.

Note that the digital photo frame 9700 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory in which image data taken with a digital camera is stored is inserted in the recording medium insertion portion of the digital photo frame 9700, whereby the image data can be displayed on the display portion 9703.

The digital photo frame 9700 may be configured to transmit and receive data wirelessly. The structure may be employed in which desired image data is transferred wirelessly to be displayed.

Figure 19A:
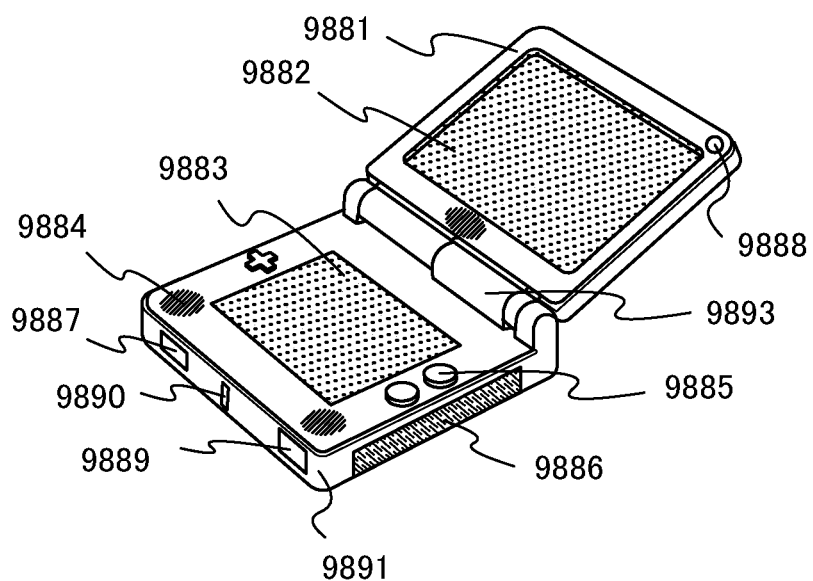
FIGS. 19A and 19B are each a view illustrating an electronic appliance.

FIG. 19A illustrates a portable amusement machine including two housings, a housing 9881 and a housing 9891. The housings 9881 and 9891 are joined with a joint portion 9893 such that the portable amusement machine is foldable. A display portion 9882 and a display portion 9883 are incorporated in the housing 9881 and the housing 9891, respectively.

Any of the semiconductor devices described in the above embodiments can be applied to the display portion 9883. For example, a plurality of thin film transistors described in the above embodiments can be disposed as switching elements of pixels.

In addition, the portable amusement machine illustrated in FIG. 19A includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above and other structures provided with at least a thin film transistor disclosed in this specification can be employed. The portable amusement machine may be provided with an additional accessory as appropriate. The portable amusement machine illustrated in FIG. 19A has a function of reading a program or data stored in a recording medium to display it on the display portion, and a function of sharing information with another portable amusement machine by wireless communication. The portable amusement machine illustrated in FIG. 19A can have various functions without limitation to the above.

A semiconductor device disclosed in this specification can be applied to an electronic paper. An electronic paper can be used for electronic appliances of a variety of fields as long as they display data. For example, an electronic paper can be applied to an e-book reader (electronic book), a poster, an advertisement in a vehicle such as a train, or displays of various cards such as a credit card. An example of the electronic appliance is illustrated in FIG. 19B.

Figure 19B:
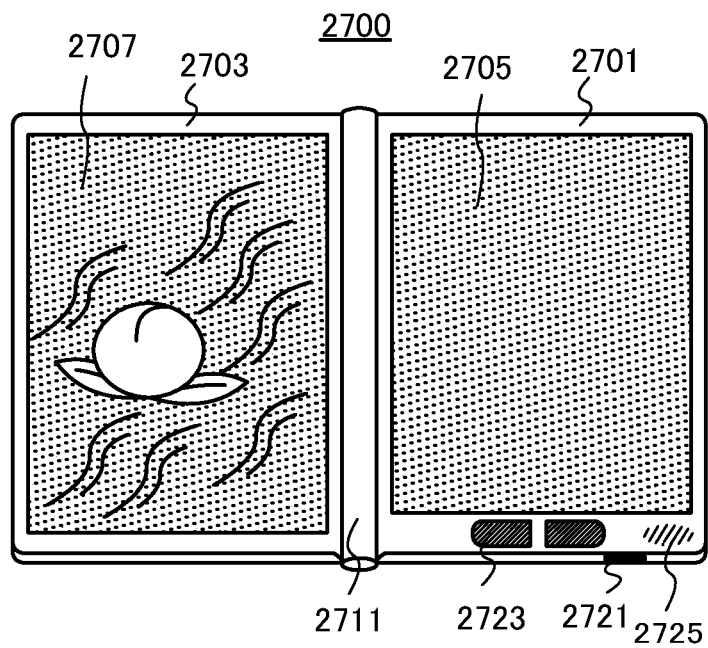

FIG. 19B illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 19B) can display text and a display portion on the left side (the display portion 2707 in FIG. 19B) can display graphics.

FIG. 19B illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may transmit and receive data wirelessly. Through wireless communication, desired book data or the like can be purchased and downloaded from an electronic book server.

Figure 20:
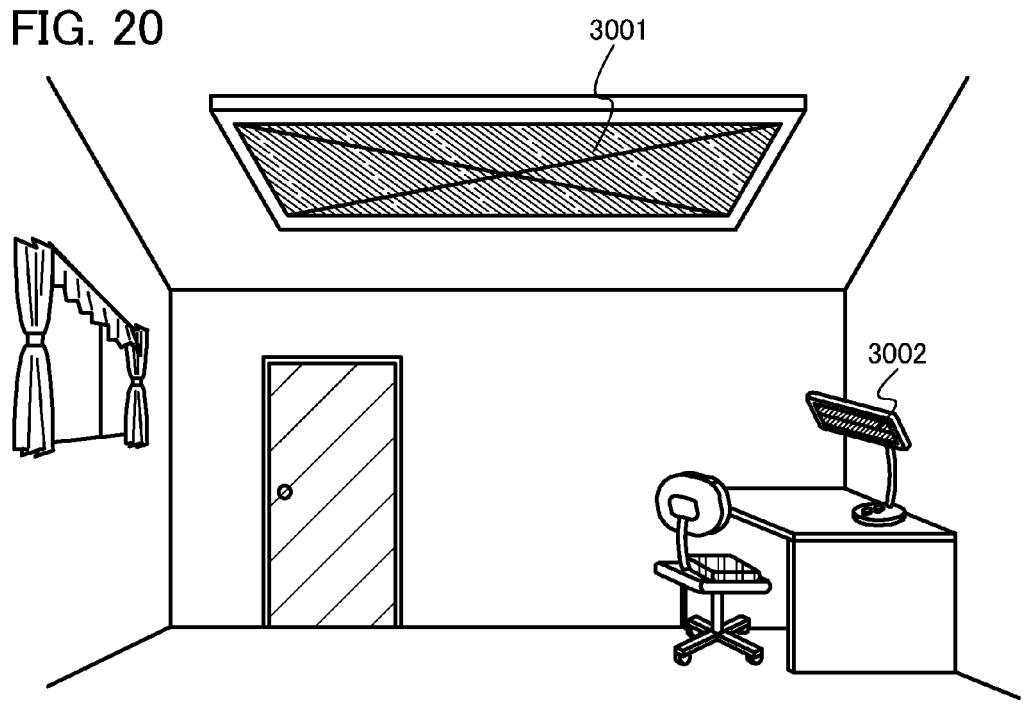
FIG. 20 is a view illustrating electronic appliances.

FIG. 20 illustrates an example in which a light-emitting device which is an example of the semiconductor device formed using any of the above embodiments is used as an indoor lighting device 3001. Since the light-emitting device in this specification can be enlarged, the light-emitting device can be used as a large-area lighting device. Further, the light-emitting device described in the above embodiment can be used as a desk lamp 3002. Note that a lighting device includes, in its category, a wall light, a light for an inside of a car, an evacuation light, and the like in addition to a ceiling light and a desk lamp.

In the above-described manner, the semiconductor device described in any of Embodiments 1 to 8 can be applied to a variety of electronic appliances such as the ones described above, whereby highly reliable electronic appliances can be provided.

This embodiment can be implemented in combination with any of the other embodiments, as appropriate.

This application is based on Japanese Patent Application serial no. 2009-276274 filed with Japan Patent Office on Dec. 4, 2009, the entire contents of which are hereby incorporated by reference.

The invention claimed is:

1. A semiconductor device comprising a transistor, the transistor comprising:
   an oxide semiconductor layer;
   a gate electrode layer adjacent to the oxide semiconductor layer;
   a gate insulating layer interposed between the oxide semiconductor layer and the gate electrode layer; and
   a source electrode layer in contact with the oxide semiconductor layer and a drain electrode layer in contact with the oxide semiconductor layer,
   wherein a work function ($\phi_m$) of a conductor used for the source electrode layer and the drain electrode layer satisfies $\phi_m > \chi + E_g/2$,
   wherein a barrier for holes ($\phi_{Bp}$) represented by ($\chi + E_g - \phi_m$) is less than 0.25 eV, and
   wherein an electron affinity of an oxide semiconductor used for the oxide semiconductor layer is represented by $\chi$ (eV) and a band gap of the oxide semiconductor used for the oxide semiconductor layer is represented by $E_g$ (eV).

2. The semiconductor device according to claim 1, wherein the conductor is a metal oxide.

3. A semiconductor device comprising a transistor, the transistor comprising:
   an oxide semiconductor layer including at least one of indium, gallium, and zinc;
   a gate electrode layer adjacent to the oxide semiconductor layer;
   a gate insulating layer interposed between the oxide semiconductor layer and the gate electrode layer; and
   a source electrode layer in contact with the oxide semiconductor layer and a drain electrode layer in contact with the oxide semiconductor layer,
   wherein a work function ($\phi_m$) of a conductor used for the source electrode layer and the drain electrode layer satisfies $\phi_m > \chi + E_g/2$,
   wherein a barrier for holes ($\phi_{Bp}$) represented by ($\chi + E_g - \phi_m$) is less than 0.25 eV, and
   wherein an electron affinity of an oxide semiconductor used for the oxide semiconductor layer is represented by $\chi$ (eV) and a band gap of the oxide semiconductor used for the oxide semiconductor layer is represented by $E_g$ (eV).

4. The semiconductor device according to claim 3, wherein the conductor is a metal oxide.

5. A semiconductor device comprising a p-channel transistor and an n-channel transistor,
   the p-channel transistor comprising:
      a first oxide semiconductor layer;
      a first gate electrode layer adjacent to the first oxide semiconductor layer;
      a first gate insulating layer interposed between the first oxide semiconductor layer and the first gate electrode layer; and
      a first source electrode layer in contact with the first oxide semiconductor layer and a first drain electrode layer in contact with the first oxide semiconductor layer,
   the n-channel transistor comprising:
      a second oxide semiconductor layer;
      a second gate electrode layer adjacent to the second oxide semiconductor layer;
      a second gate insulating layer interposed between the second oxide semiconductor layer and the second gate electrode layer; and
      a second source electrode layer in contact with the second oxide semiconductor layer and a second drain electrode layer in contact with the second oxide semiconductor layer,
   wherein a work function ($\phi_{m1}$) of a first conductor used for the first source electrode layer and the first drain electrode layer satisfies $\phi_{m1} > \chi_1 + E_{g1}/2$,
   wherein a barrier for holes ($\phi_{Bp1}$) represented by ($\chi_1 + E_{g1} - \phi_{m1}$) is less than 0.25 eV, and
   wherein an electron affinity of a first oxide semiconductor used for the first oxide semiconductor layer is represented by $\chi_1$ (eV) and a band gap of the first oxide semiconductor used for the first oxide semiconductor layer is represented by $E_{g1}$ (eV).

6. The semiconductor device according to claim 5,
   wherein the first conductor is a metal oxide, and
   wherein a second conductor used for the second source electrode layer and the second drain electrode layer is metal.

7. The semiconductor device according to claim 5,
   wherein the first oxide semiconductor layer and the second oxide semiconductor layer include at least one of indium, gallium, and zinc.

8. The semiconductor device according to claim 5,
   wherein the first oxide semiconductor used for the first oxide semiconductor layer and a second oxide semiconductor used for the second oxide semiconductor layer are formed using a same material.

* * * * *